(12) United States Patent
Oh et al.

(10) Patent No.: US 11,601,611 B2
(45) Date of Patent: Mar. 7, 2023

(54) PULSE GENERATOR AND IMAGE SENSOR INCLUDING THE SAME

(71) Applicant: SAMSUNG ELECTRONICS CO., LTD., Suwon-si (KR)

(72) Inventors: Hyuk Oh, Yongin-si (KR); Sungyong Kim, Hwaseong-si (KR); Beomsu Yun, Hwaseong-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/523,100

(22) Filed: Nov. 10, 2021

(65) Prior Publication Data

US 2022/0232186 A1 Jul. 21, 2022

(30) Foreign Application Priority Data

Jan. 20, 2021 (KR) .................. 10-2021-0008264

(51) Int. Cl.
| | |
|---|---|
| *H04N 5/376* | (2011.01) |
| *H04N 5/378* | (2011.01) |
| *H04N 5/357* | (2011.01) |
| *H03K 19/20* | (2006.01) |
| *H03K 19/21* | (2006.01) |
| *H03K 3/03* | (2006.01) |
| *H03M 1/56* | (2006.01) |
| *H03K 3/037* | (2006.01) |

(52) U.S. Cl.
CPC ........... *H04N 5/3765* (2013.01); *H03K 3/037* (2013.01); *H03K 19/20* (2013.01); *H03K 19/21* (2013.01); *H04N 5/378* (2013.01); *H03M 1/56* (2013.01)

(58) Field of Classification Search
CPC .... H04N 5/3765; H04N 5/378; H04N 5/3575; H03K 19/20; H03K 19/21; H03K 19/09429; H03K 23/62; H03K 3/356104; H03M 1/56
See application file for complete search history.

(56) References Cited

U.S. PATENT DOCUMENTS

| | | | |
|---|---|---|---|
| 8,446,483 B2 | 5/2013 | Ui et al. | |
| 8,994,575 B2 | 3/2015 | Hagihara | |
| 9,019,138 B2 | 4/2015 | Iwaki | |
| 9,208,834 B2 | 12/2015 | Choi | |
| 9,712,772 B2 | 7/2017 | Kim et al. | |
| 9,900,013 B2 | 2/2018 | Hwang | |
| 10,084,468 B1 | 9/2018 | Boemler | |
| 11,202,026 B2 * | 12/2021 | Kurokawa | H04N 5/37452 |
| 2006/0034142 A1 * | 2/2006 | Onishi | G11C 8/00 |
| | | | 36/230.06 |

(Continued)

*Primary Examiner* — Marly S Camargo
(74) *Attorney, Agent, or Firm* — Lee IP Law, P.C.

(57) ABSTRACT

An image sensor is provided. The image sensor includes a counting code generator configured to generate a counting code, a pixel array including at least one pixel, a correlated double sampling (CDS) circuit configured to compare a magnitude of a pixel signal output from the at least one pixel with a magnitude of a ramp signal and to output a corresponding comparison signal, a pulse generator configured to generate a pulse signal synchronized with a first clock signal based on the comparison signal, and a counter circuit configured to latch a value of the counting code to correspond to a transition of a level of the comparison signal based on the pulse signal.

20 Claims, 15 Drawing Sheets

(56) References Cited

U.S. PATENT DOCUMENTS

| | | | |
|---|---|---|---|
| 2012/0081979 A1* | 4/2012 | An | G11C 7/22 365/189.05 |
| 2012/0140572 A1* | 6/2012 | Kim | G11C 7/00 365/189.05 |
| 2013/0063627 A1* | 3/2013 | Hashimoto | H04N 5/217 348/241 |
| 2013/0279273 A1* | 10/2013 | Choi | G11C 7/10 365/189.05 |
| 2015/0049232 A1* | 2/2015 | Kim | H04N 5/37455 348/308 |
| 2015/0124137 A1* | 5/2015 | Sato | H04N 5/3745 348/308 |
| 2022/0124278 A1* | 4/2022 | Cho | H04N 5/37457 |

* cited by examiner

PULSE GENERATOR AND IMAGE SENSOR INCLUDING THE SAME

CROSS-REFERENCE TO RELATED APPLICATION

Korean Patent Application No. 10-2021-0008264, filed on Jan. 20, 2021, in the Korean Intellectual Property Office, and entitled: "Pulse Generator and Image Sensor Including the Same," is incorporated by reference herein in its entirety.

BACKGROUND

1. Field

Embodiments relate to a pulse generator and an image sensor including the same.

2. Description of the Related Art

As the number of pixels of image sensors increases, an analog-to-digital converter (ADC) may be operated at a high speed. In the high-speed operation of the ADC, a frequency of a counter may increase, and power consumption may increase in proportion to the frequency of the counter.

SUMMARY

Embodiments are directed to an image sensor, including: a counting code generator configured to generate a counting code; a pixel array including at least one pixel; a correlated double sampling circuit configured to compare a magnitude of a pixel signal output from the at least one pixel with a magnitude of a ramp signal, and to output a comparison signal; a pulse generator configured to generate a pulse signal synchronized with a first clock signal based on the comparison signal; and a counter circuit configured to latch a code value of the counting code to correspond to a transition of a level of the comparison signal based on the pulse signal.

Embodiments are directed to a pulse generator, including: a clock synchronization circuit configured to receive an input signal and a first clock signal, and to output a pull-up signal and a pull-down signal synchronized with the first clock signal based on the input signal; a pull-up latch circuit configured to generate a first output signal based on the pull-up signal; a pull-down latch circuit configured to generate a second output signal based on the pull-down signal; and an output circuit configured to generate a pulse signal based on the first output signal and the second output signal.

Embodiments are directed to an image sensor, including: a pixel array including at least one pixel; a correlated double sampling circuit configured to compare a magnitude of a pixel signal output from the at least one pixel with a magnitude of a ramp signal, and to output a comparison signal; a timing controller configured to generate a reference clock signal; a counting code generator configured to generate a first clock signal by dividing the reference clock signal, and to generate a counting code; a pulse generator configured to be delayed for a certain time from a timing at which a level of the comparison signal transitions, and to generate a pulse signal including a pulse having a pulse width corresponding to the first clock signal; and a counter circuit configured to latch a code value of the counting code based on the pulse signal.

BRIEF DESCRIPTION OF THE DRAWINGS

Features will become apparent to those of skill in the art by describing in detail example embodiments with reference to the attached drawings in which.

DETAILED DESCRIPTION

Figure 1:
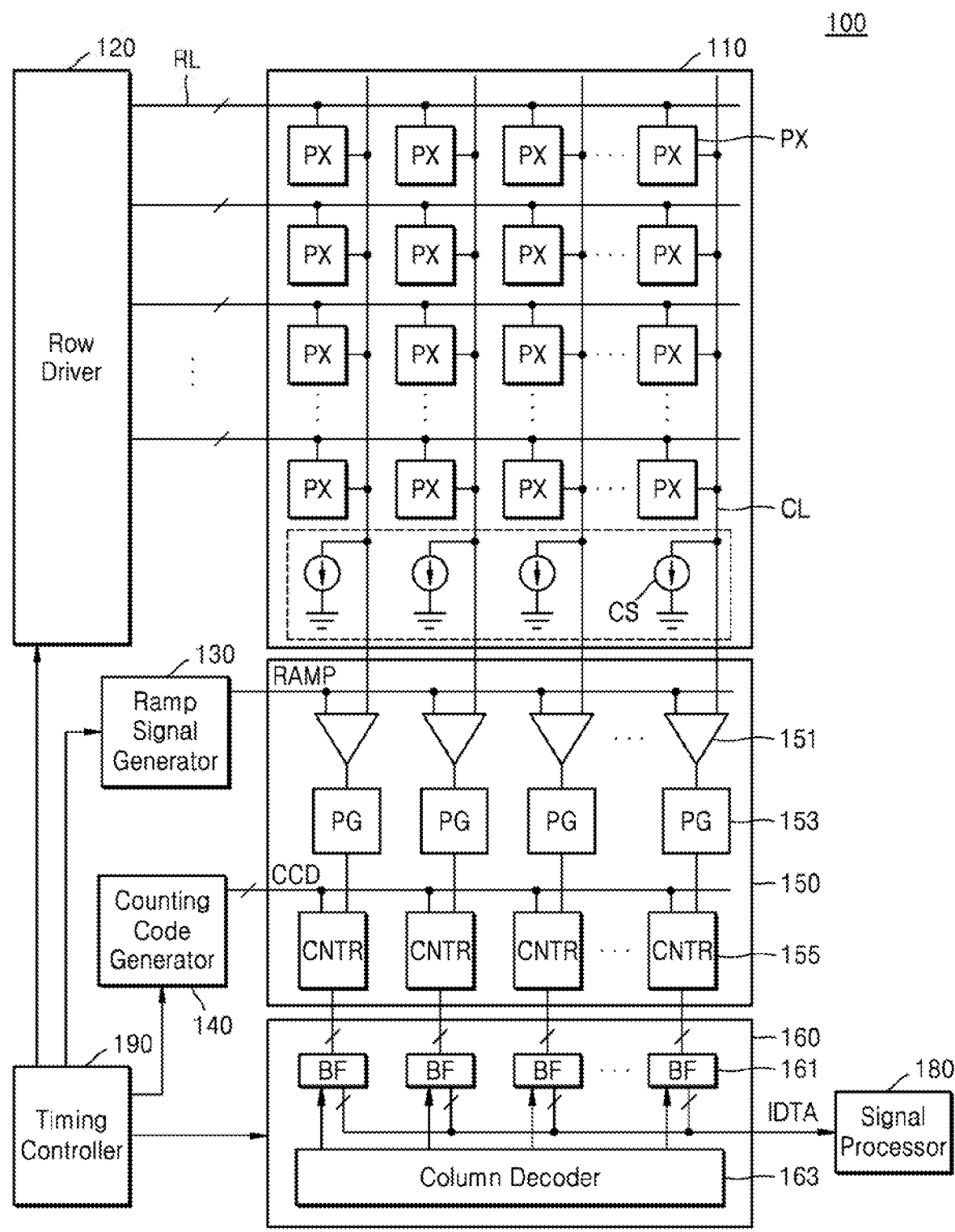
FIG. 1 is a block diagram illustrating an image sensor according to an example embodiment.

FIG. 1 is a block diagram illustrating an image sensor 100 according to an example embodiment.

The image sensor 100 may be mounted in an electronic device having an image or light sensing function. For example, the image sensor 100 may be mounted in electronic devices such as cameras, smartphones, wearable devices, Internet of things (IoT) devices, home appliances, tablet personal computers (PC), personal digital assistants (PDA), portable multimedia players (PMP), navigation systems, drones, or advanced driver assistance systems (ADASs). In addition, the image sensor 100 may be mounted in an electronic device provided as a component in vehicles, furniture, manufacturing facilities, doors, or various measuring devices.

The image sensor 100 may include a pixel array 110, a row driver 120, a ramp signal generator 130, a counting code generator 140, and an analog-to-digital conversion (ADC) circuit 150, a data output circuit 160, a signal processor 180, and a timing controller 190.

The pixel array 110 may include a plurality of row lines RL, a plurality of column lines CL, and a plurality of pixels PX connected to the plurality of column lines CL and arranged in rows and columns. A current source CS may be connected to each of the plurality of column lines CL.

Each of the plurality of pixels PX may include at least one photoelectric conversion device. The pixel PX may detect light using the photoelectric conversion device and may output an image signal, which is an electrical signal, according to the detected light. The photoelectric conversion device may include, e.g., a photodiode, a phototransistor, a photo gate, or a pinned photodiode.

Each of the plurality of pixels PX may detect light in a certain spectral range. For example, the plurality of pixels PX may include a red pixel for converting light in a red spectral range into an electric signal, a green pixel for converting light in a green spectral range into an electric signal, and a blue pixel for converting light in a blue spectral range into an electrical signal. In another implementation, the plurality of pixels may further include a white pixel. In another implementation, the plurality of pixels may include pixels combined in different color components, e.g., a yellow pixel, a cyan pixel, and a green pixel.

A color filter array, for transmitting light in a certain spectral range, may be above the plurality of pixels PX, and a color detectable by a corresponding pixel may be determined according to a color filter above each of the plurality of pixels. In another implementation, a certain photoelectric conversion device may convert light in a certain wavelength band into an electrical signal according to a level of an electrical signal applied thereto.

The current source CS may provide a bias current to a pixel PX (e.g., a selected pixel) connected to a corresponding column line CL. Here, the bias current refers to a current output (or applied) from a driving transistor of the pixel PX.

The row driver 120 may drive the pixel array 110 in units of rows. The row driver 120 may decode a row control signal (e.g., an address signal) received from the timing controller 190, and select at least one of the row lines constituting the pixel array 110 in response to the decoded result. For example, the row driver 120 may generate a selection signal for selecting one of a plurality of rows. The pixel array 110 may output a pixel signal, e.g., a pixel voltage, from a row selected by the selection signal provided from the row driver 120. The pixel signal may include a reset signal and an image signal.

The row driver 120 may transmit control signals for outputting the pixel signal to the pixel array 110, and the pixel PX may operate in response to the control signals to output a pixel signal.

The ramp signal generator 130 may generate a ramp signal RAMP (e.g., a ramp voltage), of which the level rises or falls with a predetermined slope, under the control of the timing controller 190. The ramp signal RAMP may be provided to each of a plurality of correlated double sampling (CDS) circuits 151 provided in the ADC circuit 150.

The counting code generator 140 may generate a counting code CCD under the control of the timing controller 190. The counting code CCD may be provided to each of a plurality of counter circuits 155. In an example embodiment, the counting code generator 140 may be implemented as a gray code generator. The counting code generator 140 may generate a plurality of code values having a resolution according to a set number of bits as the counting code CCD. For example, when a 10-bit code is set, the counting code generator 140 may generate the counting code CCD including 1024 code values which sequentially increase or decrease.

The ADC circuit 150 may include CDS circuits 151, a plurality of pulse generators 153, and a plurality of counter circuits 155. The ADC circuit 150 may convert a pixel signal (e.g., a pixel voltage) input from the pixel array 110 into a pixel value, a digital signal. Each pixel signal received through each of the plurality of column lines CL may be converted into a pixel value, which is a digital signal, by the CDS circuit 151, the pulse generator 153, and the counter circuit 155.

The CDS circuit 151 may compare the pixel signal received through the column line CL with the ramp signal RAMP, and output a comparison result. The CDS circuit 151 may output a comparison signal that transitions from a first level (e.g., logic high) to a second level (e.g., logic low) when a level of the ramp signal RAMP is the same as a level of the pixel signal. A timing at which the level of the comparison signal transitions may be determined according to the level of the pixel signal.

The CDS circuit 151 may sample and hold the pixel signal provided from the pixel PX according to a CDS method, and dually sample a level (e.g., a reset signal) of certain noise and a level according to an image signal and generate a comparison signal based on a level corresponding to a difference therebetween. In an example embodiment, the CDS circuit 151 may include one or more comparators. The comparator may be implemented as an operational transconductance amplifier (OTA) (or a differential amplifier), for example.

The pulse generator 153 may output a pulse signal including a pulse corresponding to a moment at which a transition of the comparison signal output from the CDS circuit 151 occurs. For example, the pulse generator 153 may be delayed for a predetermined time based on a time point at which the comparison signal is transitioned to output a pulse signal including a pulse having a width of a predetermined time. The pulse generator 153 may generate a pulse signal so that the data output circuit 160 may store a count value to be described below.

According to an example embodiment, the pulse generator 153 may include a pull-up latch circuit and a pull-down latch circuit, instead of a delay cell that generates a delayed pulse starting from the moment the comparison signal output from the CDS circuit 151 transitions using a transistor (long length Tr) having a long channel width. In the case of using the delay cell, the degree of a delay may vary according to a change in power. That is, a width of a pulse in the pulse signal may be changed, and due to this, a timing at which the latch operation is performed may be changed. Meanwhile, the pulse signal according to an example embodiment may be a pulse signal generated to be synchronized with a clock signal using the pull-up latch circuit and the pull-down latch circuit. That is, a pulse signal having a pulse width consistent even with a change in power.

Further, according to an example embodiment, the pulse generator 153 may be designed to generate the pulse signal having a pulse during one cycle of the clock signal. Accordingly, power consumption of the pulse generator 153 may be reduced. A configuration of the pulse generator 153 according to an example embodiment will be described below with reference to FIGS. 3 to 7.

The counter circuit 155 may count a timing at which the level of the comparison signal output from the CDS circuit 151 transitions, and output a count value. In an example embodiment, the counter circuit 155 may include a latch circuit and an operation circuit. The latch circuit may receive a counting code CCD from the counting code generator 140 and a pulse signal (indicating a transition timing of the comparison signal) from the pulse generator 153, and may latch a code value of the counting code CCD based on the pulse signal.

The latch circuit may latch each of a code value corresponding to a reset signal, e.g., a reset value, and a code value corresponding to an image signal, e.g., an image signal value. The operation circuit may calculate the reset value and the image signal value, and may generate an image signal value from which a reset level of the pixel PX is removed. The counter circuit 155 may output the image signal value from which the reset level is removed as a pixel value.

In the present example embodiment, it is described that the image sensor 100 includes the counting code generator 140 and the counter circuit 155 includes the circuit for latching the code value of the counting code CCD received from the counting code generator 140, but the counter circuit 155 of the image sensor 100 may be configured to include an up-counter that sequentially increases a count value based on a counting clock signal provided from the timing controller 190, an operation circuit, an up/down counter, or a bit-wise inversion counter.

The data output circuit 160 may temporarily store a pixel value output from the ADC circuit 150 and then output the stored pixel value. The data output circuit 160 may include a plurality of column memories 161 and a column decoder 163. The column memory 161 may store pixel values received from the counter circuit 155. In an example embodiment, each of the plurality of column memories 161 may also be provided in the counter circuit 155. A plurality of pixel values stored in the plurality of column memories 161 may be output as image data IDTA under the control of the column decoder 163.

The timing controller 190 may output a control signal to each of the row driver 120, the ramp signal generator 130, the counting code generator 140, the ADC circuit 150, and the data output circuit 160, and control an operation or timing of the row driver 120, the ramp signal generator 130, the counting code generator 140, the ADC circuit 150, and the data output circuit 160.

The signal processor 180 may perform noise reduction processing, gain adjustment, waveform shaping processing, interpolation processing, white balance processing, gamma processing, edge enhancement processing, binning, and the like on image data. In an example embodiment, the signal processor 180 may be provided in an external processor, i.e., external to the image sensor 100.

Although the pulse generator 153, the counter circuit 155, and the counting code generator 140 are illustrated and described as being included in the image sensor 100 with reference to FIG. 1, the pulse generator 153, the counter circuit 155, and the counting code generator 140 may be included to another electronic device that performs a counting operation.

Figure 2:
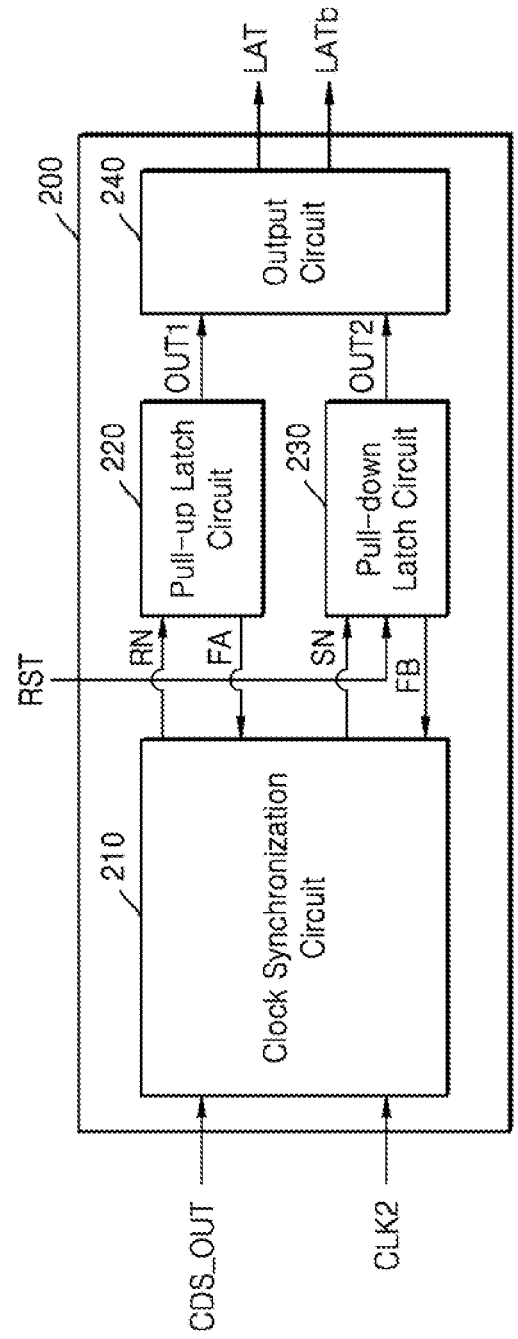
FIG. 2 is a block diagram illustrating a pulse generator according to an example embodiment.

FIG. 2 is a block diagram illustrating a pulse generator 200 according to an example embodiment.

In an example embodiment, the pulse generator 200 of FIG. 2 may be applied to the pulse generator 153 of FIG. 1.

Referring to FIG. 2, the pulse generator 200 may include a clock synchronization circuit 210, a pull-up latch circuit 220, a pull-down latch circuit 230, and an output circuit 240.

The clock synchronization circuit 210 may receive a second clock signal CLK2 from the counting code generator 140. In an example embodiment, the timing controller 190 may generate a clock signal and provide the generated clock signal to the counting code generator 140, and the counting code generator 140 may generate a second clock signal CLK2 having a period of n times (n is a positive integer) of the clock signal. Hereinafter, for ease of understanding, it is assumed that the second clock signal CLK2 has a period twice that of the clock signal. In another implementation, the clock synchronization circuit 210 may be configured to receive a clock signal from the timing controller 190.

The clock synchronization circuit 210 may receive a comparison signal CDS_OUT from the CDS circuit 151. The clock synchronization circuit 210 may generate a pull-up signal RN and a pull-down signal SN synchronized with the second clock signal CLK2 based on the comparison signal CDS_OUT. The clock synchronization circuit 210 may provide the pull-up signal RN to the pull-up latch circuit 220 and provide the pull-down signal SN to the pull-down latch circuit 230. The pull-up signal RN and the pull-down signal SN may be used to generate the output signals OUT1 and OUT2 of the pull-up latch circuit 220 and the pull-down latch circuit 230 to be described below.

The clock synchronization circuit 210 may provide the generated pull-up signal RN and pull-down signal SN to the counter circuit 155. The pull-up signal RN and the pull-down signal SN may be used to latch a least significant bit (LSB) of the count value output from the counter circuit 155.

The clock synchronization circuit 210 may receive a first feedback signal FA from the pull-up latch circuit 220 and receive a second feedback signal FB from the pull-down latch circuit 230. The clock synchronization circuit 210 may use the first feedback signal FA to generate the pull-up signal RN and use the second feedback signal FB to generate the pull-down signal SN. A configuration of the clock synchronization circuit 210 will be described below with reference to FIG. 3.

The pull-up latch circuit 220 may generate a first output signal OUT1 based on the pull-up signal RN from the clock synchronization circuit 210 and the first feedback signal FA of a feedback loop in the pull-up latch circuit 220. The pull-down latch circuit 230 may generate a second output signal OUT2 based on the pull-down signal SN from the clock synchronization circuit 210 and the second feedback signal FB of a feedback loop in the pull-down latch circuit 230. Configurations of the pull-up latch circuit 220 and the pull-down latch circuit 230 will be described below with reference to FIGS. 5 and 6.

The pull-up latch circuit 220 and the pull-down latch circuit 230 may receive a first reset signal RST, and may respectively reset an operation of generating the output signals OUT1 and OUT2 according to the first reset signal RST. The first reset signal RST may be a control signal generated by the timing controller 190 of FIG. 1, and may indicate a reset timing of a pulse generating operation of the pulse generator 200.

The output circuit 240 may receive the first output signal OUT1 from the pull-up latch circuit 220 and receive the second output signal OUT2 from the pull-down latch circuit 230. The output circuit 240 may generate a pulse signal LAT based on the first output signal OUT1 and the second output signal OUT2. In an example embodiment, the output circuit 240 may generate an inverted pulse signal LATb obtained by inverting the pulse signal LAT. The output circuit 240 may output the generated pulse signal LAT and/or the inverted pulse signal LATb.

In another implementation the pulse generator 200 may transmit the pull-up signal RN and the pull-down signal SN to the counter circuit 155. The counter circuit 155 may latch the LSB of the count value based on the received pull-up signal RN and pull-down signal SN. Details thereof will be described below with reference to FIG. 8.

Figure 3:
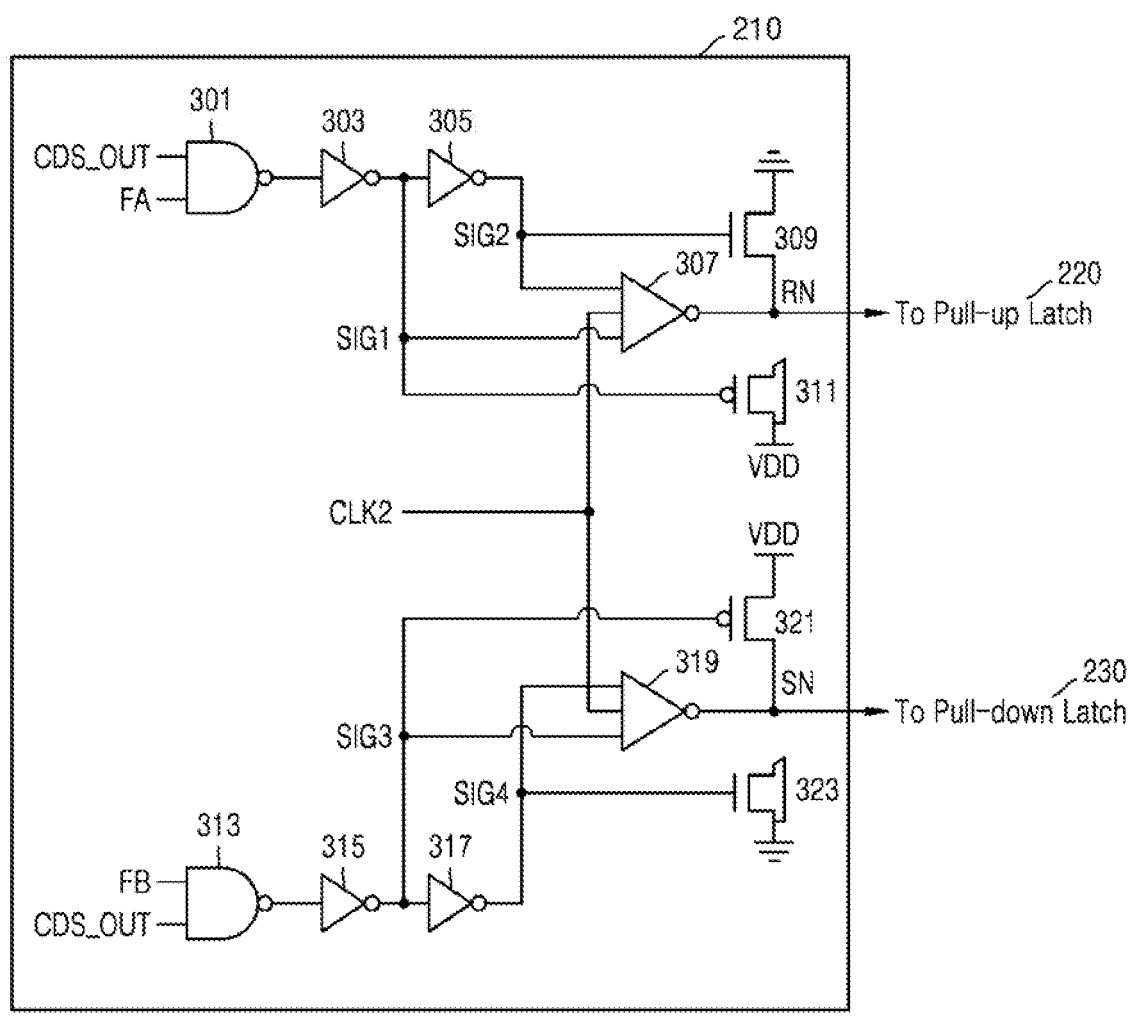
FIG. 3 is a circuit diagram illustrating a clock synchronization circuit according to an example embodiment.

FIG. 3 is a circuit diagram illustrating the clock synchronization circuit 210 according to an example embodiment. FIG. 3 is a circuit diagram illustrating the clock synchronization circuit 210 of FIG. 2.

Referring to FIGS. 2 and 3, the clock synchronization circuit 210 may include a plurality of gates 301, 303, 305, 313, 315, and 317 (including a first NAND gate 301, a first NOT gate 303, a second NOT gate 305, a second NAND gate 313, a third NOT gate 315, and a fourth NOT gate 317, a plurality of inverters 307 and 319, including a first inverter 307 and a second inverter 319) and a plurality of transistors 309, 311, 321, and 323 (including a first transistor 309, a second transistor 311, a third transistor 321, and a fourth transistor 323).

In an example embodiment, the clock synchronization circuit 210 may include the first
NAND gate 301, the first NOT gate 303, and the second NOT gate 305. For example, the comparison signal CDS_OUT from the CDS circuit 151 and the first feedback signal FA from the pull-up latch circuit 220 may be input to the first NAND gate 301. A NAND gate may output logic low only when all the input signals indicate logic high. That is, the first NAND gate 301 may output logic low only when both the comparison signal CDS_OUT and the first feedback signal FA, which are input signals, indicate logic high. In addition, an output signal from the first NAND gate 301 may be input to the first NOT gate 303. The first NOT gate 303 may output a first signal SIG1 obtained by inverting the input signal. In addition, the first signal SIG1 may be input to the second NOT gate 305. The second NOT gate 305 may output a second signal SIG2 obtained by inverting the input signal.

The clock synchronization circuit 210 may include the first inverter 307. In an example embodiment, the first inverter 307 may be implemented as a tri-state inverter, and the second signal SIG2, the second clock signal CLK2, and the first signal SIG1 may be input to the first inverter 307. The first inverter 307 may output a pull-up signal RN obtained by inverting the second clock signal CLK2 based on the first signal SIG1 and the second signal SIG2, or may electrically isolate (i.e., float) an input terminal and an output terminal thereof. A configuration of the first inverter 307 will be described below with reference to FIG. 4.

The clock synchronization circuit 210 may include the first transistor 309. A first terminal of the first transistor 309 may be grounded, a second terminal of the first transistor 309 may be connected to the output terminal of the first inverter 307. When the first inverter 307 is floated, the first transistor 309, instead of the first inverter 307, may determine a logic level of the pull-up signal RN. The first transistor 309 may be driven based on the second signal SIG2 and may be implemented as, e.g., an n-channel MOSFET (NMOS FET). The clock synchronization circuit 210 may include the second transistor 311. A power voltage VDD may be applied to first and second terminals of the second transistor 311, and the second transistor 311 may be driven based on the first signal SIG1. In an example embodiment, the second transistor 311 may be implemented as a p-channel MOSFET (PMOS FET). The second transistor 311 can be used as a capacitor.

The clock synchronization circuit 210 may include the second NAND gate 313, the third NOT gate 315, and a fourth NOT gate 317. For example, the comparison signal CDS_OUT of the CDS circuit 151 and the second feedback signal FB of the pull-down latch circuit 230 may be input to the second NAND gate 313. The second NAND gate 313 may output logic low only when both input signals (e.g., the comparison signal CDS_OUT and the second feedback signal FB) indicate logic high. In addition, an output signal from the second NAND gate 313 may be input to the third NOT gate 315. The third NOT gate 315 may output a third signal SIG3 obtained by inverting the input signal. In addition, the third signal SIG3 may be input to the fourth NOT gate 317. The fourth NOT gate 317 may output a fourth signal SIG4 obtained by inverting the input signal.

The clock synchronization circuit 210 may include the second inverter 319. In an example embodiment, the second inverter 319 may also be implemented as a tri-state inverter like the first inverter 307, and the fourth signal SIG4, the second clock signal CLK2, and the third signal SIG3 may be input to the second inverter 319. The second inverter 319 may output a pull-down signal SN by inverting the second clock signal CLK2 based on the third signal SIG3 and the fourth signal SIG4, or may electrically isolate an input terminal and an output terminal thereof.

The clock synchronization circuit 210 may include a third transistor 321. The power voltage VDD may be applied to a first terminal of the third transistor 321, the pull-down signal SN may be input to a second terminal of the third transistor 321, and the second inverter 319. When the second inverter 319 is floated, the third transistor 321, instead of the second inverter 319, may determine a logic level of the pull-down signal SN. The third transistor 321 may be driven based on the third signal SIG3 and may be implemented as, e.g., a p-channel MOSFET. The clock synchronization circuit 210 may include the fourth transistor 323. First and second terminals of the fourth transistor 323 may be grounded, and the fourth transistor 323 may be driven based on the fourth signal SIG4. In an example embodiment, the fourth transistor 323 may be implemented as, e.g., a p-channel MOSFET.

The clock synchronization circuit 210 may provide a pull-up signal RN, which is an output signal from the first inverter 307, to the pull-up latch circuit 220. In addition, the clock synchronization circuit 210 may provide a pull-down signal SN, which is an output signal from the second inverter 319, to the pull-down latch circuit 230.

Figure 4:
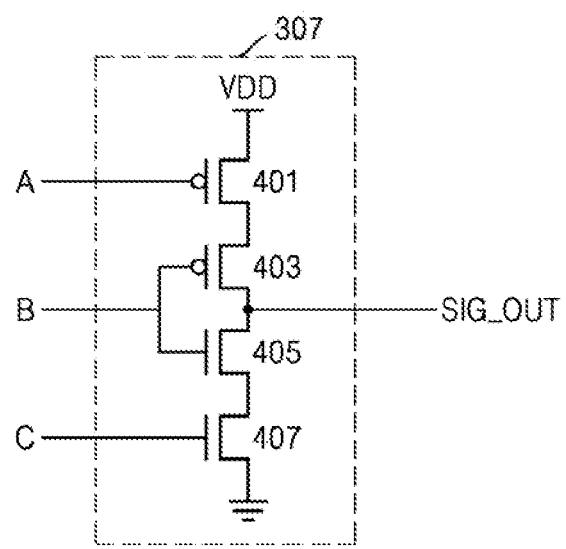
FIG. 4 is a circuit diagram illustrating a tri-state inverter according to an example embodiment.

FIG. 4 is a circuit diagram illustrating the tri-state inverter 307 according to an example embodiment. FIG. 4 is a circuit diagram of the first inverter 307 of FIG. 3 implemented as a tri-state inverter.

Referring to FIG. 4, the first inverter 307 may include two PMOS transistors 401 and 403, including a first PMOS transistor 401 and a second PMOS transistor 403, and two NMOS transistors 405 and 407, including a first NMOS transistor 405 and a second NMOS transistor 407. In an example embodiment, in the first inverter 307, the PMOS transistors 401 and 403 and the NMOS transistors 405 and 407 may be connected in series. A first input signal A may be input to a gate of the first PMOS transistor 401, a second input signal B may be input to gates of the second PMOS transistor 403 and the first NMOS transistor 405, and a third input signal C may be input to a gate of the second NMOS transistor 407. In addition, an output signal SIG OUT from the first inverter 307 may be output through a terminal to which the second PMOS transistor 403 and the first NMOS transistor 405 are connected.

When the first input signal A, the second input signal B, and the third input signal C are each logic low, the first inverter 307 may generate an output signal obtained by inverting the second input signal B. In addition, when the first input signal A is logic low and the third input signal C is logic high, the first inverter 307 may generate an output signal obtained by inverting the second input signal B. In addition, when the first input signal A, the second input signal B, and the third input signal C are each logic high, the first inverter 307 may generate an output signal obtained by inverting the second input signal B. The first inverter 307 may be floated in the other cases.

For example, in FIG. 3, the first input signal A is the second signal SIG2, the second input signal B is the second clock signal CLK2, and the third input signal C is the first signal SIG1.

The first inverter 307 may be implemented with the same elements as those of the second inverter 319 described above with reference to FIG. 3, and may be implemented with the same elements as those of a third inverter 325 to a sixth inverter 343 described below with reference to FIGS. 5 and 6.

Figure 5:
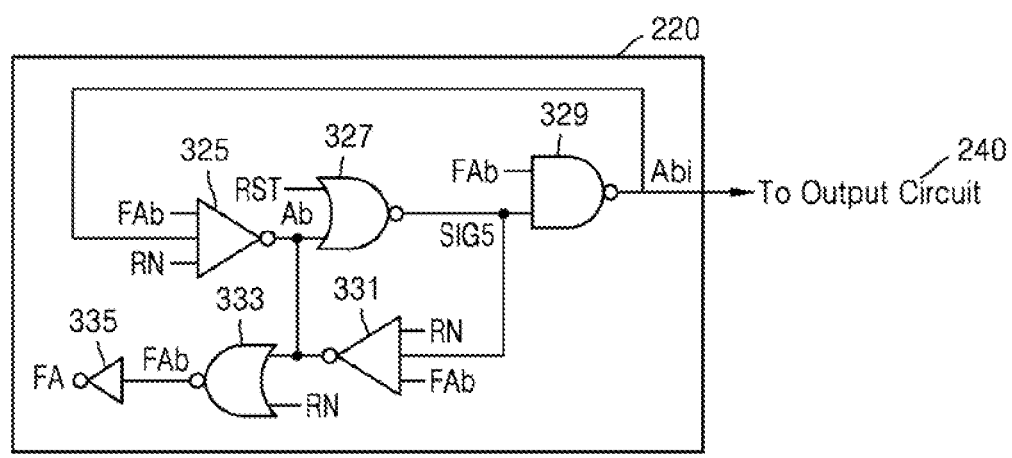
FIG. 5 is a circuit diagram illustrating a pull-up latch circuit according to an example embodiment.

FIG. 5 is a circuit diagram illustrating the pull-up latch circuit 220 according to an example embodiment. FIG. 5 is a circuit diagram illustrating the pull-up latch circuit 220 of FIG. 2.

Referring to FIGS. 2 and 5, the pull-up latch circuit 220 may include a plurality of gates 327, 329, 333, and 335 (including a first NOR gate 327, a third NAND gate 329, a second NOR gate 333, and a fifth NOT gate 335) and a plurality of inverters 325 and 331 (including a third inverter 325 and fourth inverter 331).

In an example embodiment, the pull-up latch circuit 220 may include the third inverter 325. In an example embodiment, the third inverter 325 may be implemented as a tri-state inverter, and a first inverted feedback signal FAb, a first intermediate signal Abi, and a pull-up signal RN may be input thereto. The third inverter 325 may output a second intermediate signal Ab obtained by inverting the first intermediate signal Abi based on the first inverted feedback signal FAb and the pull-up signal RN, or may electrically isolate (i.e., float) an input terminal and an output terminal thereof.

The pull-up latch circuit 220 may include the first NOR gate 327 and the third NAND gate 329. For example, the first reset signal RST and the second intermediate signal Ab may be input to the first NOR gate 327. A NOR gate may only output logic high when all of input signals indicate logic low. That is, the first NOR gate 327 may output logic high only when both the first reset signal RST and the second intermediate signal Ab, which are input signals, indicate logic low. In addition, the first NOR gate 327 may output a fifth signal SIG5 as an output signal, and the fifth signal SIG5 may be input to the third NAND gate 329. For example, the fifth signal SIG5 and the first inverted feedback signal FAb may be input to the third NAND gate 329. The third NAND gate 329 may output the first intermediate signal Abi as an output signal. The first intermediate signal Abi may be provided, as the first output signal OUT1, to the output circuit 240 of the pull-up latch circuit 220.

The pull-up latch circuit 220 may include the fourth inverter 331. For example, the fourth inverter 331 may be implemented as a tri-state inverter, and the pull-up signal RN, the fifth signal SIG5, and the first inverted feedback signal FAb may be input thereto. The fourth inverter 331 may output the second intermediate signal Ab by inverting the fifth signal SIG5 based on the pull-up signal RN and the first inverted feedback signal FAb, or may electrically isolate an input terminal and an output terminal thereof. In addition, the output terminal of the fourth inverter 331 may be connected to the output terminal of the third inverter 325.

The pull-up latch circuit 220 may include the second NOR gate 333 and the fifth NOT gate 335. For example, the second intermediate signal Ab and the pull-up signal RN may be input to the second NOR gate 333. The second NOR gate 333 may output logic high only when both input signals (e.g., the second intermediate signal Ab and the pull-up signal RN) indicate logic low. In addition, the second NOR gate 333 may output the first inverted feedback signal FAb as an output signal, and the first inverted feedback signal FAb may be input to the fifth NOT gate 335. The second NOR gate 333 may output the first feedback signal FA obtained by inverting the first inverted feedback signal FAb. The first feedback signal FA may be provided to the clock synchronization circuit 210.

Figure 6:
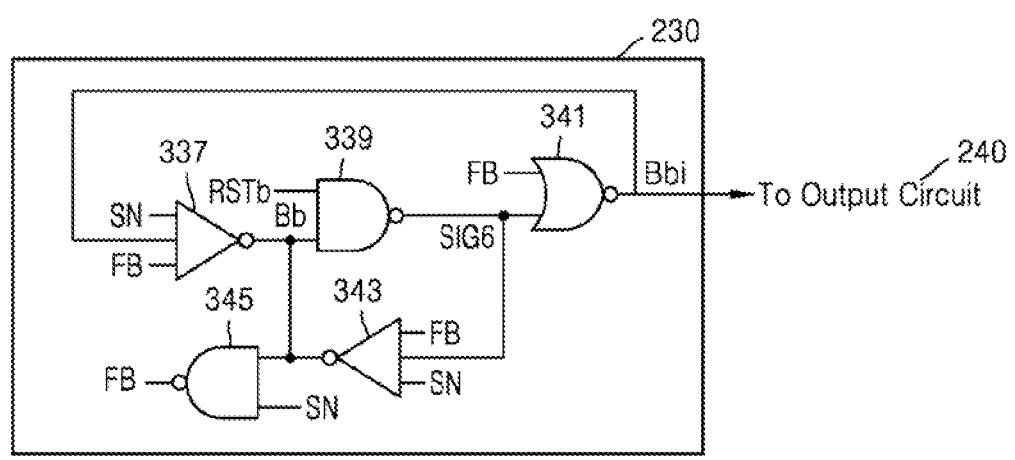
FIG. 6 is a circuit diagram illustrating a pull-down latch circuit according to an example embodiment.

FIG. 6 is a circuit diagram illustrating the pull-down latch circuit 230 according to an example embodiment. FIG. 6 is a circuit diagram illustrating the pull-down latch circuit 230 of FIG. 2.

Referring to FIGS. 2 and 6, the pull-down latch circuit 230 may include a plurality of gates 339, 341, and 345 (including a fourth NAND gate 339, a third NOR gate 341, and a fifth NAND gate 345) and a plurality of inverters 337 and 343 (including a fifth inverter 337 and a sixth inverter 343).

In an example embodiment, the pull-down latch circuit 230 may include the fifth inverter 337. In an example embodiment, the fifth inverter 337 may be implemented as a tri-state inverter, and the pull-down signal SN, a third intermediate signal Bbi, and the second feedback signal FB may be input thereto. The fifth inverter 337 may output a fourth intermediate signal Bb obtained by inverting the third intermediate signal Bbi based on the pull-down signal SN and the second feedback signal FB, or may electrically isolate (i.e., float) an input terminal and an output terminal thereof.

The pull-down latch circuit 230 may include the fourth NAND gate 339 and the third NOR gate 341. For example, a first inverted reset signal RSTb and the fourth intermediate signal Bb may be input to the fourth NAND gate 339. Here, the first inverted reset signal RSTb may be generated by inverting the first reset signal RST using a NOT gate. In addition, the fourth NAND gate 339 may output a sixth signal SIG6 as an output signal, and the sixth signal SIG6 may be input to the third NOR gate 341. For example, the sixth signal SIG6 and the second feedback signal FB may be input to the third NOR gate 341. The third NOR gate 341 may output the third intermediate signal Bbi as an output signal. The third intermediate signal Bbi may be provided, as the second output signal OUT2 from the pull-down latch circuit 230, to the output circuit 240.

The pull-down latch circuit 230 may include the sixth inverter 343. For example, the sixth inverter 343 may be implemented as a tri-state inverter, and the second feedback signal FB, the sixth signal SIG6, and the pull-down signal SN may be input thereto. The sixth inverter 343 may output the fourth intermediate signal Bb by inverting the sixth signal SIG6 based on the second feedback signal FB and the pull-down signal SN, or may electrically isolate an input terminal and an output terminal thereof. Also, the output terminal of the sixth inverter 343 may be connected to the output terminal of the fifth inverter 337.

The pull-down latch circuit 230 may include the fifth NAND gate 345. For example, the fourth intermediate signal Bb and the pull-down signal SN may be input to the fifth NAND gate 345. In addition, the fifth NAND gate 345 may output the second feedback signal FB as an output signal, and the second feedback signal FB may be provided to the clock synchronization circuit 210.

Figure 7:
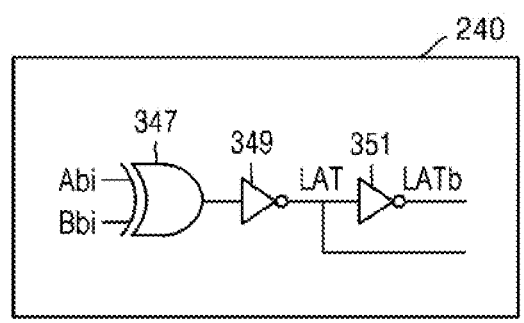
FIG. 7 is a circuit diagram illustrating an output circuit according to an example embodiment.

FIG. 7 is a circuit diagram illustrating the output circuit 240 according to an example embodiment. In detail, FIG. 7 is a circuit diagram illustrating the output circuit 240 of FIG. 2.

Referring to FIGS. 2 and 7, the output circuit 240 may include a plurality of gates 347, 349 and 351, including a first XOR gate 347, a sixth NOT gate 349, and a seventh NOT gate 351.

In an example embodiment, the output circuit 240 may include the first XOR gate 347, the sixth NOT gate 349, and the seventh NOT gate 351. For example, a first intermediate signal Abi and the third intermediate signal Bbi may be input to the first XOR gate 347. An XOR gate may output logic low when the inputs have the same level, and may output logic high when the inputs have different levels. An output signal from the first XOR gate 347 may be input to the sixth NOT gate 349. The sixth NOT gate 349 may output the pulse signal LAT by inverting the input signal. In addition, the pulse signal LAT, which is an output signal from the sixth NOT gate 349, may be input to the seventh NOT gate 351. The seventh NOT gate 351 may output an inverted pulse signal LATb by inverting the input signal. The output circuit 240 may provide the pulse signal LAT and/or the inverted pulse signal LATb to the counter circuit 155.

Figure 8:
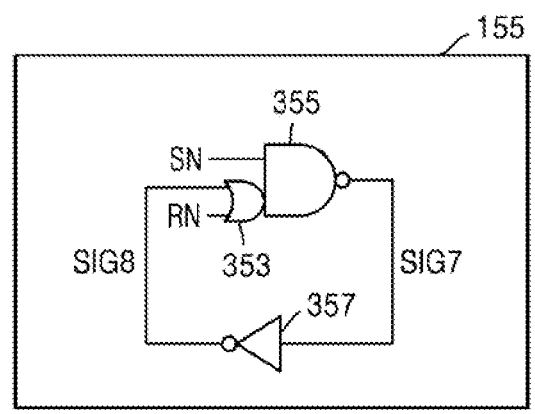
FIG. 8 is a circuit diagram illustrating a portion of a counter circuit according to an example embodiment.

FIG. 8 is a circuit diagram illustrating a portion of the counter circuit 155 according to an example embodiment. FIG. 8 is a circuit diagram illustrating an LSB latch circuit for latching the LSB of a count value among the components of the counter circuit 155 of FIG. 1.

The LSB latch circuit may include a plurality of gates 353, 355, and 357, including a first OR gate 353, a sixth NAND gate 355, and an eighth NOT gate 357. In an example embodiment, the LSB latch circuit may include the first OR gate 353, the sixth NAND gate 355, and the eighth NOT gate 357. An eighth signal SIG8 and the pull-up signal RN may be input to the first OR gate 353. The OR gate may output a logical sum of the input signals as an output signal. The output signal from the first OR gate 353 may be input to the sixth NAND gate 355.

The output signal of the first OR gate 353 and the pull-down signal SN may be input to the sixth NAND gate 355. The sixth NAND gate 355 may output a seventh signal SIG7 as an output signal. In addition, the seventh signal SIG7 may be input to the eighth NOT gate 357. The eighth NOT gate 357 may output the eighth signal SIG8 by inverting the seventh signal SIG7. The eighth signal SIG8 may be input to the first OR gate 353 described above.

According to an example embodiment, the LSB latch circuit has the seventh signal SIG7 as an LSB value of the count value. In addition, the counter circuit 155 excluding the LSB latch circuit may latch a code value from the counting code generator 140 using the pulse signal LAT and/or the inverted pulse signal LATb. In addition, the counter circuit 155 may generate a count value based on the aforementioned LSB value and the latched code value.

Figure 9:
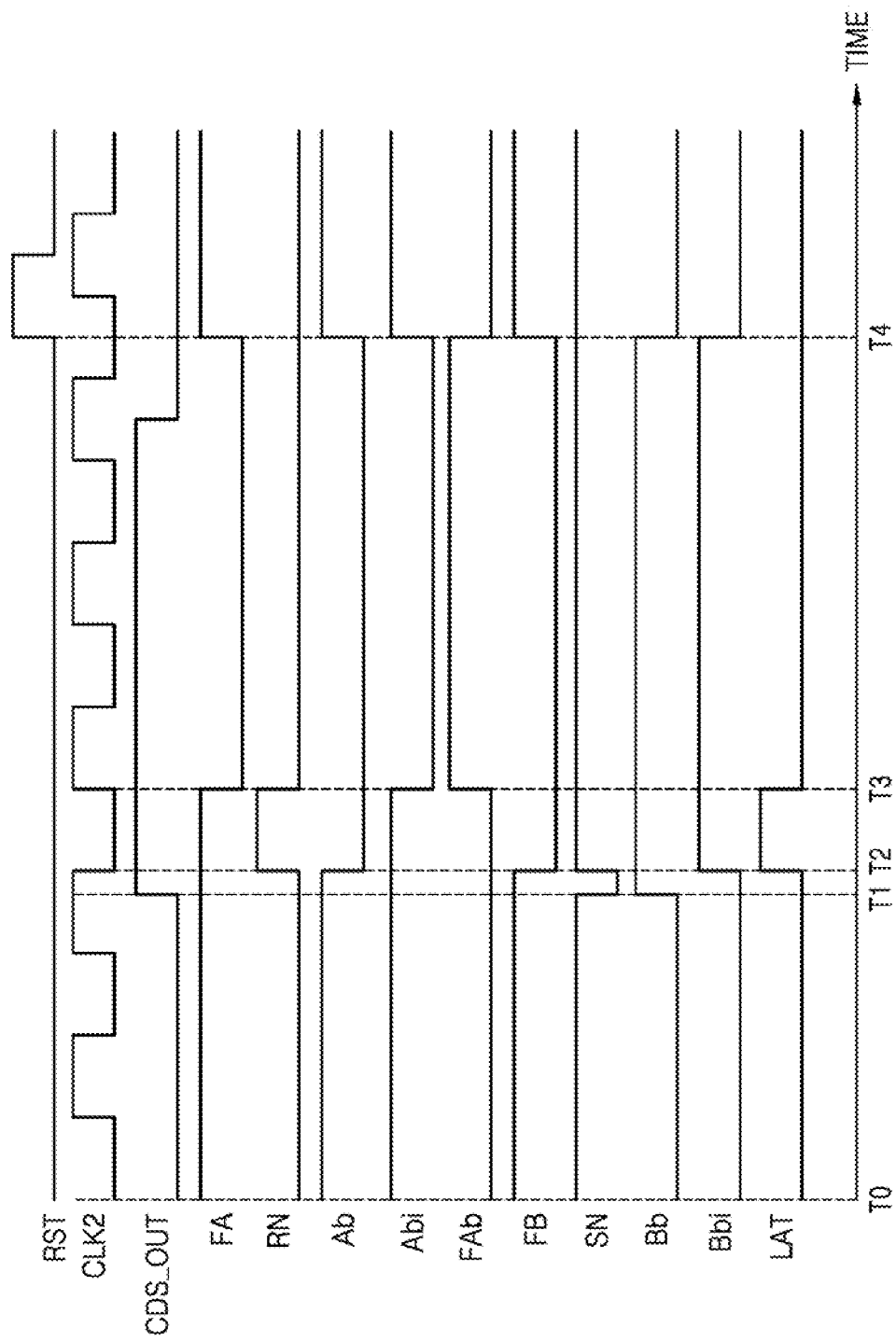
FIG. 9 is a timing diagram illustrating an operation of a pulse generator according to an example embodiment.

FIG. 9 is a timing diagram illustrating signals related to the pulse generator 200 according to an example embodiment. FIG. 9 is a timing diagram illustrating signals RST, CLK2, CDS_OUT, FA, RN, Ab, Abi, FAb, FB, SN, Bb, Bbi, and LAT related to the pulse generator 200 of FIG. 2.

Referring to FIG. 9, the second clock signal CLK2 may alternately transition to a high level and a low level according to a predetermined period. The first feedback signal FA, the first inverted feedback signal FAb, the second feedback signal FB, the first intermediate signal Abi, the second intermediate signal Ab, the third intermediate signal Bbi, the fourth intermediate signal Bb, the pull-up signal RN, and the pull-down signal SN may each have an initial state. The initial state of the aforementioned signals FA, FAb, FB, Abi, Ab, Bbi, Bb, RN, and SN may be set to a low level or a high level, and when the first reset signal RST transitions to a level (e.g., the high level) indicating reset, the aforementioned signals FA, FAb, FB, Abi, Ab, Bbi, Bb, RN, and SN may each have a level corresponding to the initial state.

For example, referring to FIG. 9, in an initial state T0, the first feedback signal FA may have a high level, the first inverted feedback signal FAb may have a low level, the second feedback signal FB may have a high level, the first intermediate signal Abi may have a high level, the second intermediate signal Ab may have a high level, the third intermediate signal Bbi may have a low level, the fourth intermediate signal Bb may have a low level, the pull-up signal RN may have a low level, and the pull-down signal SN may have a high level.

Also, the level of at least one of the aforementioned signals FA, FAb, FB, Abi, Ab, Bbi, Bb, RN, and SN may be changed according to a transition of a level of the comparison signal CDS_OUT, the second clock signal CLK2, and/or the first reset signal RST.

For example, referring to FIG. 9, when the comparison signal CDS_OUT transitions from a low level to a high level at a first time T1 after the initial state T0, the pull-down signal SN may transition from the high level to a low level and the fourth intermediate signal Bb may transition from the low level to a high level. Also, when the second clock signal CLK2 transitions from the high level to a low level at a second time T2 after the first time T1, the pull-up signal RN may transition from the low level to a high level, the second intermediate signal Ab may transition from the high level to a low level, the second feedback signal FB may transition from the high level to a low level, the pull-down signal SN may transition from the low level to a high level, and the third intermediate signal Bbi may transition from the low level to a high level.

Also, when the second clock signal CLK2 transitions from the low level to a high level at a third time T3 after the second time T2, the first feedback signal FA may transition from the high level to a low level, and pull-up signal RN may transition from the high level to a low level, the first intermediate signal Abi may transition from the high level to a low level, and the first inverted feedback signal FAb may transition from the low level to a high level.

Also, when the first reset signal RST transitions from the low level to a high level at a fourth time T4 after the third time T3, the first feedback signal FA may transition from the low level to a high level, the first intermediate signal Abi may transition from the low level to a high level, the second intermediate signal Ab may transition from the low level to a high level, the first inverted feedback signal FAb may transition from the high level to a low level, the second feedback signal FB may transition from the low level to a high level, the third intermediate signal Bbi may transition from the high level to a low level, and the fourth intermediate signal Bb may transition from the high level to a low level.

The pulse signal LAT may have a high level when the first intermediate signal Abi and the third intermediate signal Bbi have the same level, and may have a low level when the first intermediate signal Abi and the third intermediate signal Bbi have different levels. For example, referring to FIG. 9, the pulse signal LAT may have a low level from the initial state T0 to the second time T2 because the first intermediate signal Abi and the third intermediate signal Bbi have different levels, may have a high level from the second time T2 to the third time T3 because the first intermediate signal Abi and the third intermediate signal Bbi have the same level, and may have a low level after the third time T3 because the first intermediate signal Abi and the third intermediate signal Bbi have different levels. Also, because the pulse signal LAT is a signal generated through a process of synchronization with the second clock signal CLK2, a pulse of the pulse signal LAT may have the same pulse width as the second clock signal CLK2.

When comparing the pulse signal LAT with the comparison signal CDS_OUT, the pulse signal LAT may include a pulse synchronized with the second clock signal CLK2 as the comparison signal CDS_OUT transitions from a low level to a high level.

According to an example embodiment, the pulse generator 200 may generate the pulse signal LAT using the second clock signal CLK2 having a period twice that of the existing clock signal. In addition, the pulse generator 200 may operate only during two clock cycles of the second clock signal CLK2 (i.e., one clock cycle of the existing clock signal) to generate the pulse signal LAT. Accordingly, power consumption of the pulse generator 200 may be reduced.

Figure 10:
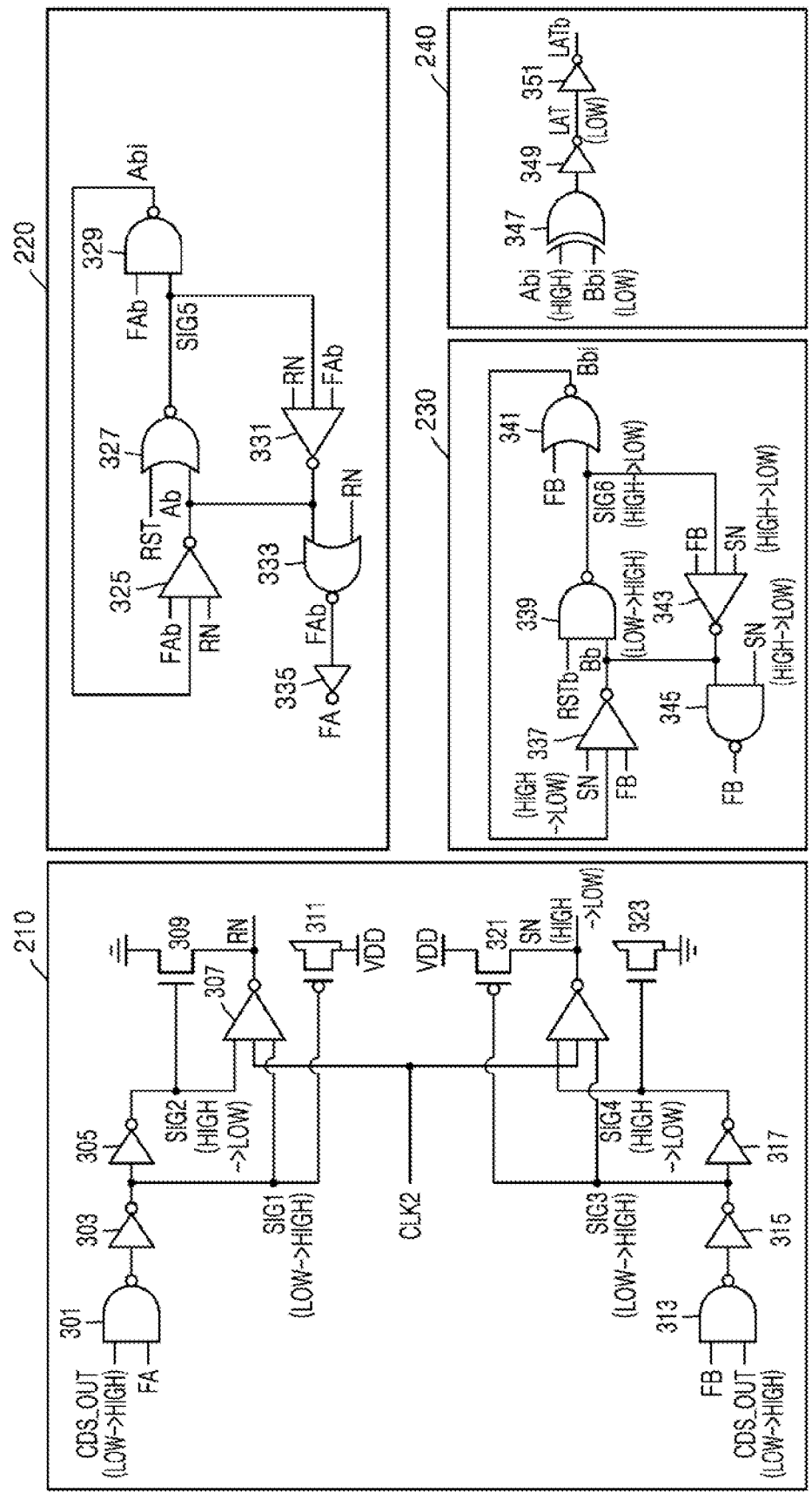
FIG. 10 is a circuit diagram illustrating an operation of a pulse generator according to an example embodiment.

FIG. 10 is a circuit diagram illustrating an operation of the pulse generator 200 according to an example embodiment. FIG. 10 is a circuit diagram illustrating an operation of the pulse generator 200 at the first time T1 of FIG. 9.

Referring to FIGS. 9 and 10, the comparison signal CDS_OUT may transition from the low level to a high level at the first time T1. Accordingly, in the clock synchronization circuit 210, an output signal from the first inverter 307 may transition from the high level to a low level, the first signal SIG1 may transition from the low level to a high level, and the second signal SIG2 may transition from the high level to a low level. In addition, the first inverter 307 may output the pull-up signal RN by inverting the second clock signal CLK2 as the second signal SIG2 having a low level and the first signal SIG1 having a high level are input. Because the second clock signal CLK2 has a high level at the first time T1, the pull-up signal RN may have a low level. Because the pull-up signal RN has the low level both in the initial state T0 and at the first time T1, a level transition does not occur. Therefore, level transition does not occur even for signals in the pull-up latch circuit 220.

In addition, as the comparison signal CDS_OUT transitions from the low level to the high level, an output signal from the second inverter 319 may transition from the high level to a low level, the third signal SIG3 may transition from the low level to a high level, and the fourth signal SIG4 may transition from the high level to a low level. In addition, the second inverter 319 may output the pull-down signal SN by inverting the second clock signal CLK2 as the fourth signal SIG4 having a low level and the third signal SIG3 having a high level are input. Because the second clock signal CLK2 has the high level at the first time T1, the pull-down signal SN may have a low level. Because the pull-down signal SN has the high level in the initial state T0, transition to a low level may occur at the first time T1. Accordingly, level transition may also occur in some of the signals in the pull-down latch circuit 230.

In the pull-down latch circuit 230, because the pull-down signal SN having a low level and the second feedback signal FB having a high level are input, the fifth inverter 337 may output the fourth intermediate signal Bb obtained by inverting the third intermediate signal Bbi having a low level. That is, the fourth intermediate signal Bb may transition from the low level to a high level. Also, because the first inverted reset signal RSTb having a high level and the fourth intermediate signal Bb having a high level are input, the fourth NAND gate 339 may output the sixth signal SIG6 having a low level. That is, the sixth signal SIG6 may transition from the high level to a low level. Because the second feedback signal FB having a high level and the sixth signal SIG6 having a low level are input, the third NOR gate 341 may output the third intermediate signal Bbi having a low level. The sixth inverter 343 may be floated because the second feedback signal FB having a high level and the pull-down signal SN having a low signal are input. Because the fourth intermediate signal Bb having a high level and the pull-down signal SN having a low level are input, the fifth NAND gate 345 may output the second feedback signal FB having a low level.

In summary, when the comparison signal CDS_OUT transitions from the low level to the high level at the first time T1, the pull-down signal SN may transition from the high level to the low level and the fourth intermediate signal Bb may transition from the low level to the high level. Meanwhile, because a level transition does not occur in the first intermediate signal Abi and the third intermediate signal Bbi, the pulse signal LAT may also maintain the low level without a level transition.

Figure 11:
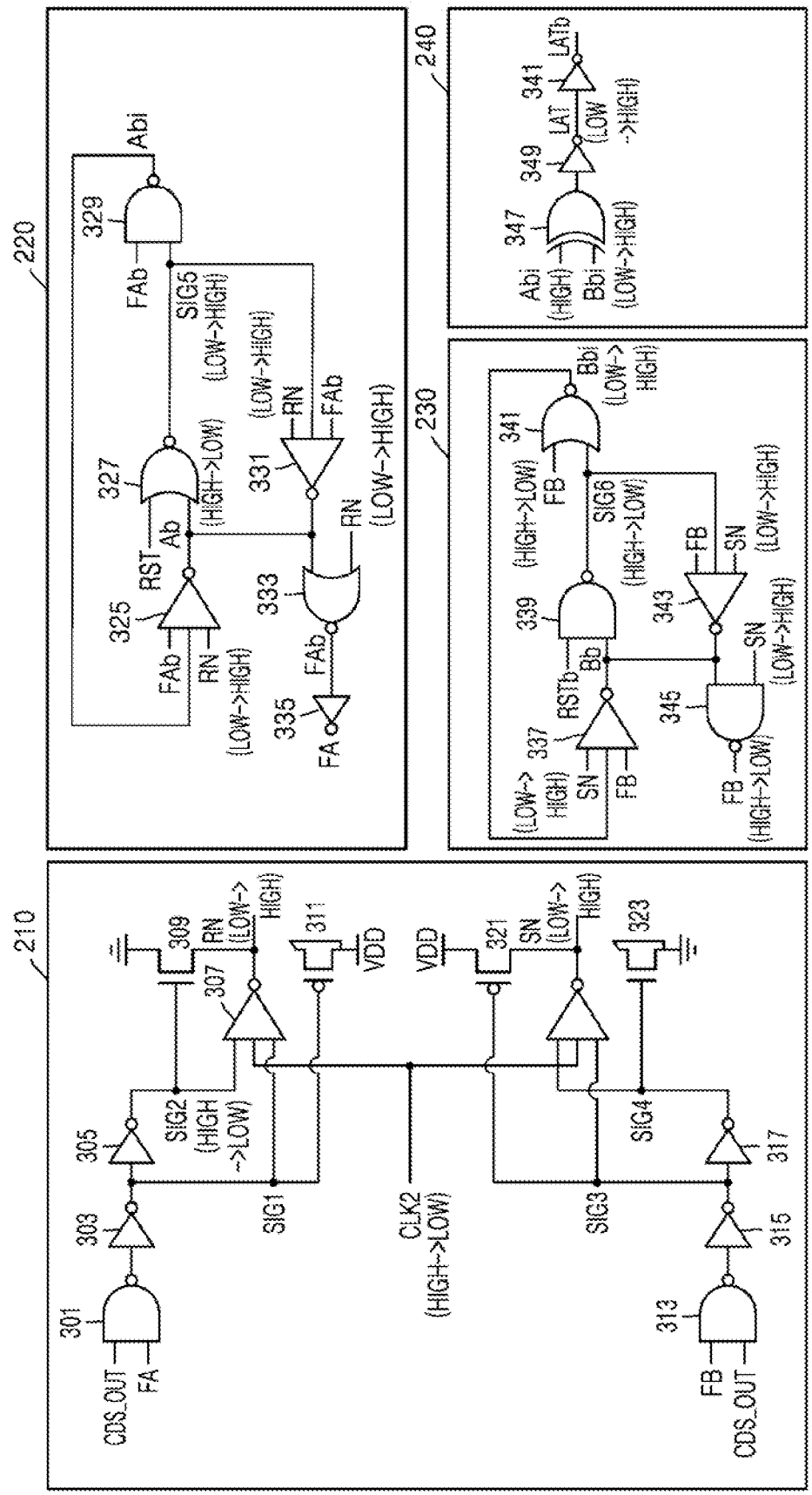
FIG. 11 is a circuit diagram illustrating an operation of a pulse generator according to an example embodiment.

FIG. 11 is a circuit diagram illustrating an operation of the pulse generator 200 according to an example embodiment. FIG. 11 is a circuit diagram illustrating an operation of the pulse generator 200 at the second time T2 of FIG. 9.

Referring to FIGS. 9 and 11, the second clock signal CLK2 may transition from a high level to a low level at the second time T2. Accordingly, the first inverter 307 may invert the second clock signal CLK2 to output the pull-up signal RN having a high level. In addition, the second inverter 319 may invert the second clock signal CLK2 to output a pull-down signal SN having a high level. Because the pull-down signal SN has the high level at both the second time T2 and the third time T3, a level transition does not occur. Accordingly, a level transition does not occur even for signals in the pull-down latch circuit 230.

In the pull-up latch circuit 220, because the first inverted feedback signal FAb having a low level and the pull-up signal RN having a high level are input, the third inverter 325 may output the second intermediate signal Ab having a low level by inverting the first intermediate signal Abi having a high level. Because the first reset signal RST having a low level and the second intermediate signal Ab having a low level are input, the first NOR gate 327 may output the fifth signal SIG5 having a high level. That is, the fifth signal SIG5 may transition from the low level to the high level. Because the first inverted feedback signal FAb having a low level and the fifth signal SIG5 having a high level are input, the third NAND gate 329 may output the first intermediate signal Abi having a high level. Because the pull-up signal RN having a high level and the first inverted feedback signal FAb having a low level are input, the fourth inverter 331 may be floated. Because the second intermediate signal Ab having a low level and the pull-up signal RN having a high level are input, the second NOR gate 333 may output the first inverted feedback signal FAb having a low level. The second NOR gate 333 may invert the first inverted feedback signal FAb having a low level and output the first feedback signal FA having a high level.

In the pull-down latch circuit 230, because the pull-down signal SN having a high level and the second feedback signal FB having a high level are input and the third intermediate signal Bbi having a low level is input, the fifth inverter 337 may be floated. The fourth NAND gate 339 may output a low level sixth signal SIG6 because the first inverted reset signal RSTb having a high level and a fourth intermediate signal Bb having a high level are inputted to the fourth NAND gate 339. Because the fourth intermediate signal Bb and the pull-down signal SN each having a high level are input, the fifth NAND gate 345 may output the second feedback signal FB having a low level. That is, the second feedback signal FB may transition from the high level to the low level. Because the second feedback signal FB having a low level and the sixth signal SIG6 having a low level are input, the third NOR gate 341 may output the third intermediate signal Bbi having a high level.

In summary, when the second clock signal CLK2 transitions from the high level to a low level at the second time T2, the pull-up signal RN and the pull-down signal SN transition from the low level to a high level, the second intermediate signal Ab and the second feedback signal FB may transition from the high level to a low level, and the third intermediate signal Bb may transition from the low level to a high level. Since a level transition of the third intermediate signal Bb occurs, the pulse signal LAT may transition from the low level to a high level.

Figure 12:
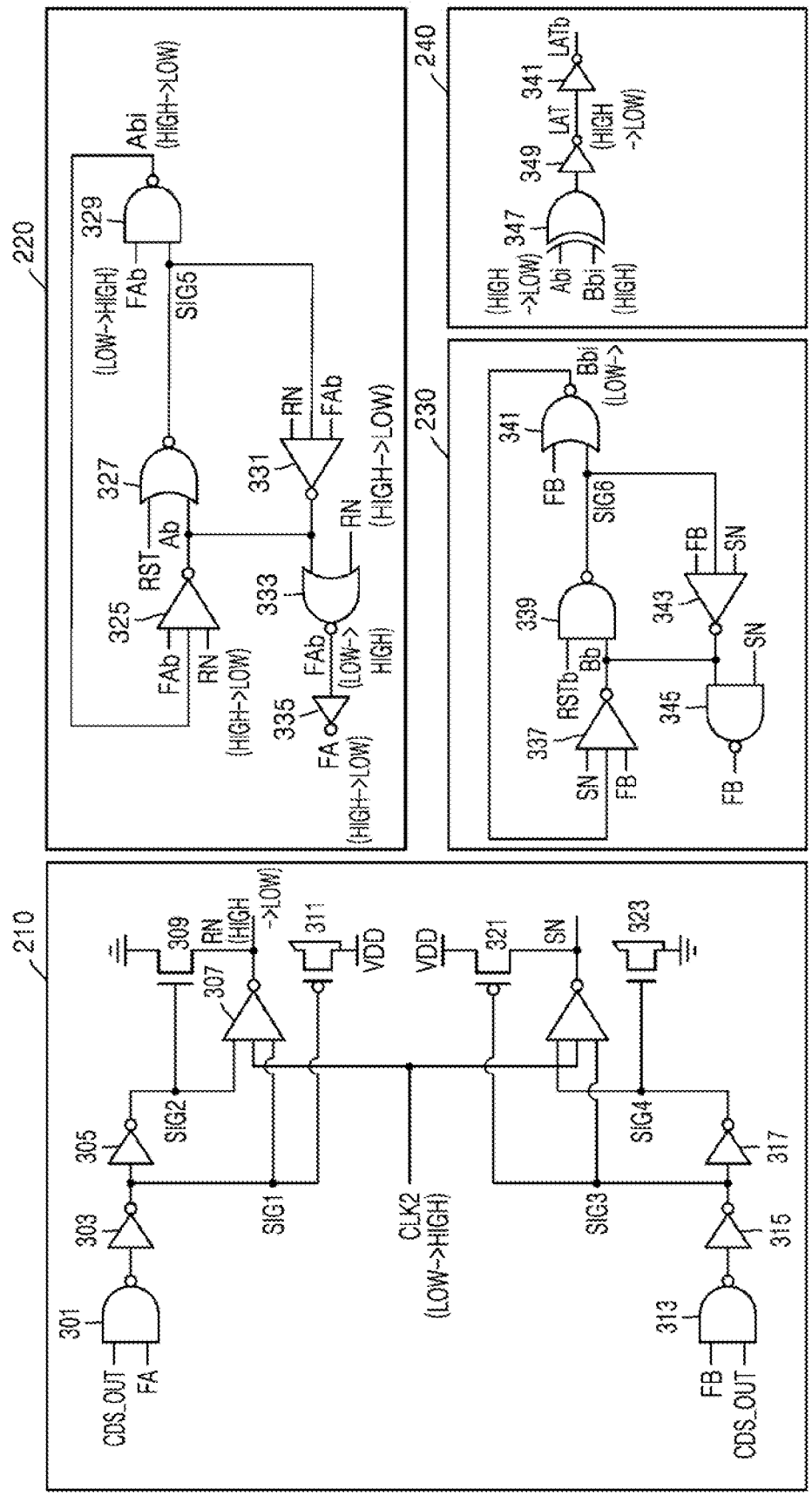
FIG. 12 is a circuit diagram illustrating an operation of a pulse generator according to an example embodiment.

FIG. 12 is a circuit diagram illustrating an operation of the pulse generator 200 according to an example embodiment. FIG. 12 is a circuit diagram illustrating an operation of the pulse generator 200 at the third time T3 of FIG. 9.

Referring to FIGS. 9 and 12, the second clock signal CLK2 may transition from the low level to a high level at the third time T3. Accordingly, the first inverter 307 may invert the second clock signal CLK2 and output the pull-up signal RN having a low level. That is, the pull-up signal RN may transition from the high level to the low level. Because the second feedback signal FB having a low level and the comparison signal CDS_OUT having a high level are input, the second NAND gate 313 may output an output signal having a high level. Accordingly, since the third signal SIG3 has a low level and the fourth signal SIG4 has a high level, the second inverter 319 may be floated. Meanwhile, since the fourth transistor 323 is turned on by the third signal SIG3, the pull-down signal SN may have a high level.

In the pull-up latch circuit 220, because the first inverted feedback signal FAb having a low level and the pull-up signal RN having a low level are input, the third inverter 325 may output the second intermediate signal Ab obtained by inverting the first intermediate signal Abi. Here, since the first intermediate signal Abi has a high level, the second intermediate signal Ab may have a low level. Because the first reset signal RST and the second intermediate signal Ab each having the low level are input, the first NOR gate 327 may output the fifth signal SIG5 having a high level. Because the second intermediate signal Ab and the pull-up signal RN, each having a low level, are input, the second NOR gate 333 may output the first inverted feedback signal FAb having a high level. That is, the first inverted feedback signal FAb may transition from a low level to a high level. In addition, the second NOR gate 333 may invert the first inverted feedback signal FAb having a high level and output the first feedback signal FA having a low level. Because the first inverted feedback signal FAb having a high level and the fifth signal SIG5 having a high level are input, the third NAND gate 329 may output the first intermediate signal Abi having a low level. That is, the first intermediate signal Abi may transition from a high level to a low level.

In summary, when the second clock signal CLK2 transitions from the low level to the high level at the third time T3, the pull-up signal RN may transition from the high level to a low level, the first intermediate signal Abi and the first feedback signal FA may transition from the high level to a low level, and the first inverted feedback signal FAb may transition from a low level to a high level. Since a level transition of the first intermediate signal Abi occurs, the pulse signal LAT may transition from the high level to a low level.

Figure 13:
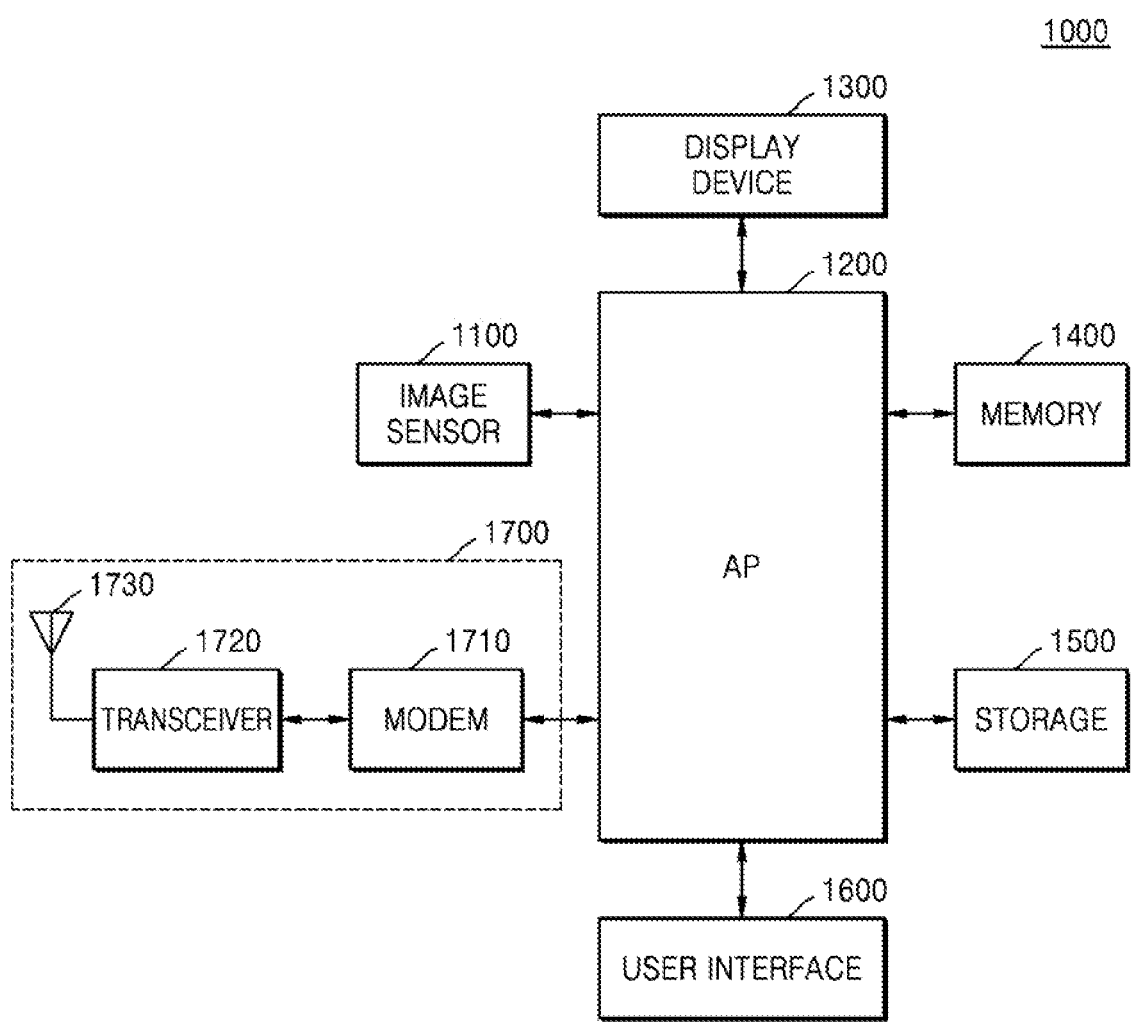
FIG. 13 is a block diagram illustrating an electronic device according to an example embodiment.

FIG. 13 is a block diagram illustrating an electronic device 1000 according to an example embodiment.

Referring to FIG. 13, the electronic device 1000 may include an image sensor 1100, an application processor (AP) 1200, a display device 1300, a memory 1400, a storage 1500, a user interface 1600, and a wireless transceiver unit 1700. The image sensor 1100 of FIG. 13 may correspond to the image sensor 100 of FIG. 1. A redundant description which is the same as the description above with reference FIG. 1 will be omitted.

The AP 1200 may be provided as a system-on-chip (SoC) that controls an overall operation of the electronic device 1000 and drives an application program, an operating system, and the like. The AP 1200 may receive image data from the image sensor 1100 and may perform image processing on the received image data. In an example embodiment, the AP 1200 may store the received image data and/or processed image data in the memory 1400 or the storage 1500.

The memory 1400 may store programs and/or data processed or executed by the AP 1200. The storage 1500 may be implemented as a nonvolatile memory device such as a NAND flash or a resistive memory. For example, the storage 1500 may be provided as a memory card (MMC, eMMC, SD, micro SD) or the like. The storage 1500 may store data and/or programs for execution algorithms that control an image processing operation of the AP 1200, and the data and/or programs may be loaded into the memory 1400 when the image processing operation is performed.

The user interface 1600 may be implemented as various devices capable of receiving a user input, such as a keyboard, a curtain key panel, a touch panel, a fingerprint sensor, and a microphone. The user interface 1600 may receive a user input and provide a signal corresponding to the received user input to the AP 1200. The wireless transceiver unit 1700 may include a modem 1710, a transceiver 1720, and an antenna 1730.

Figure 14:
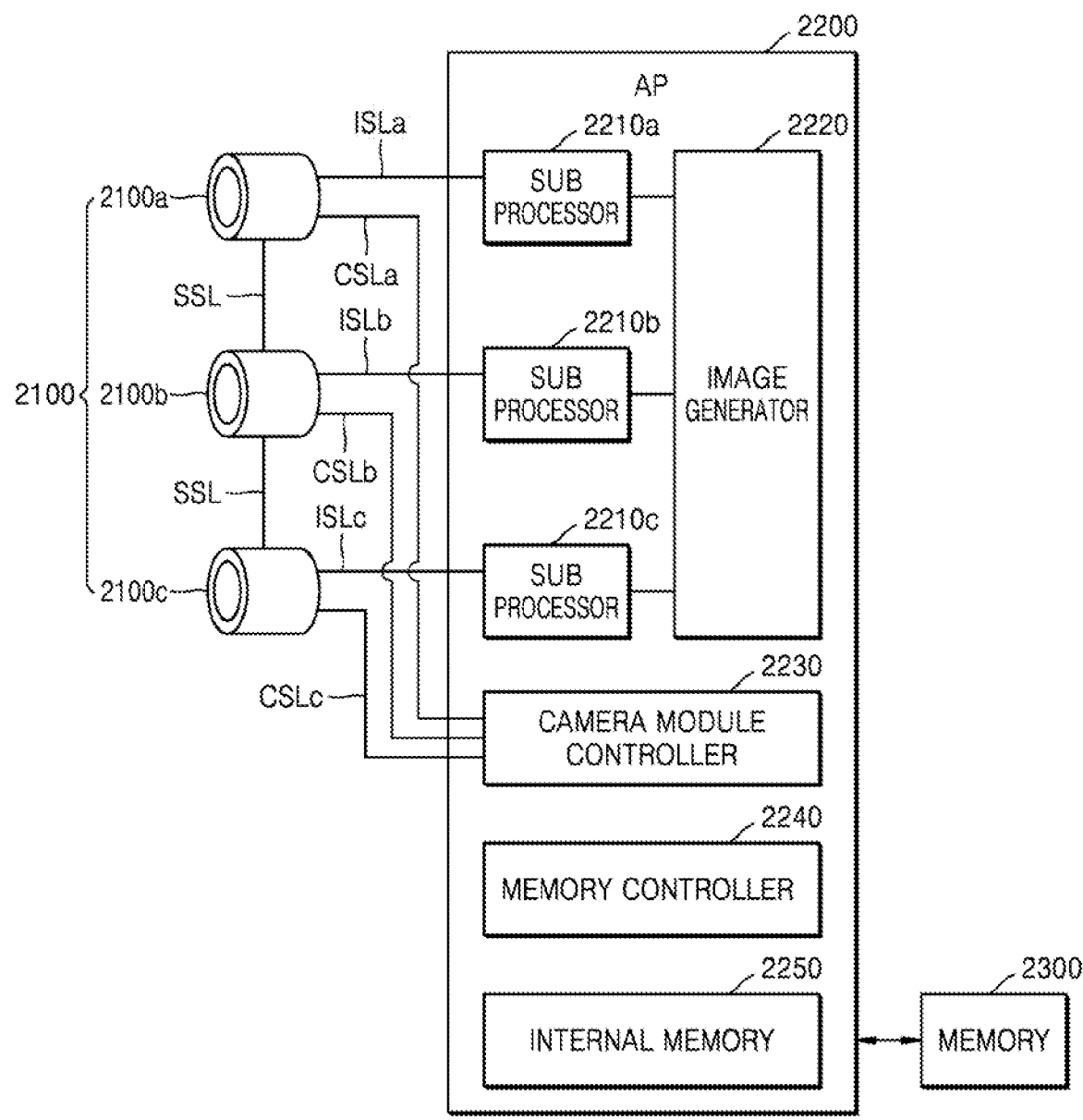
FIG. 14 is a block diagram illustrating a portion of an electronic device according to an example embodiment.
Figure 15:
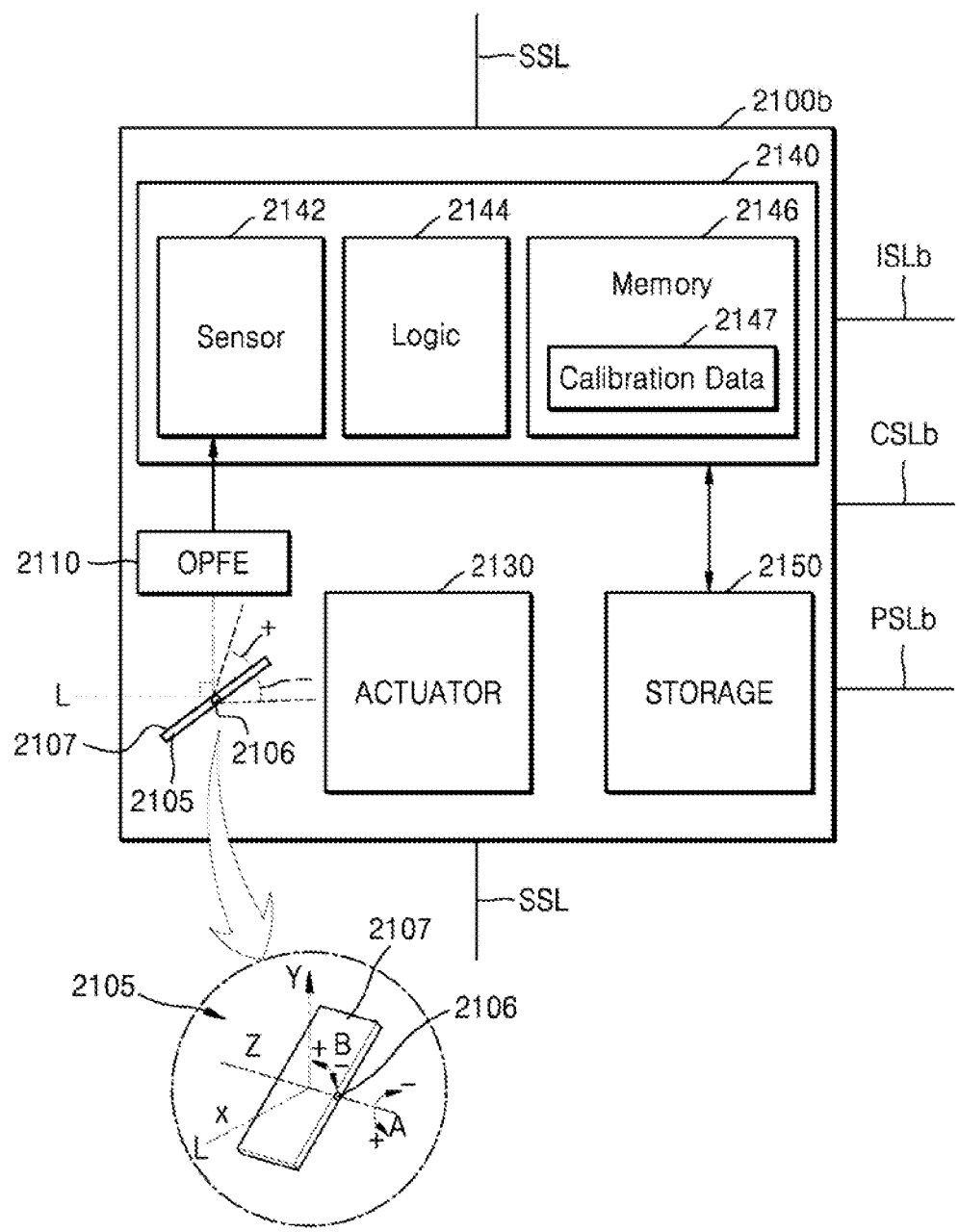
FIG. 15 is a block diagram illustrating a detailed configuration of a camera module according to an example embodiment.

FIG. 14 is a block diagram illustrating a portion of an electronic device 2000 according to an example embodiment. FIG. 14 is a diagram illustrating the electronic device 2000 as a portion of the electronic device 1000 of FIG. 13. FIG. 15 is a block diagram illustrating a configuration of a camera module 2100b according to an example embodiment. FIG. 15 is a diagram illustrating a configuration of the camera module 2100b of FIG. 14.

Referring to FIG. 14, the electronic device 2000 may include a multi-camera module 2100, an AP 2200, and a memory 2300. The memory 2300 may perform the same function as the memory 1400 shown in FIG. 13, and thus, a redundant description will be omitted.

The electronic device 2000 may capture and/or store an image of an object by using a CMOS image sensor, and may be implemented as a mobile phone, a tablet computer, or a portable electronic device. The portable electronic device may include a laptop computer, a mobile phone, a smartphone, a tablet PC, a wearable device, etc. The multi-camera module 2100 may include a first camera module 2100a, a second camera module 2100b, and a third camera module 2100c. The multi-camera module 2100 may include the image sensor 100 of FIG. 1. Meanwhile, in FIG. 14, it is illustrated that the multi-camera module 2100 includes three camera modules 2100a to 2100c, but various numbers of camera modules may be included in the multi-camera module 2100.

Hereinafter, a configuration of the camera module 2100b will be described in more detail with reference to FIG. 15, and the following description may be equally applied to the camera modules 2100a and 2100c according to an example embodiment.

Referring to FIG. 15, the camera module 2100b may include a prism 2105, an optical path folding element (OPFE) 2110, an actuator 2130, an image sensing device 2140, and a storage 2150.

The prism 2105 may include a reflective surface 2107 of a light reflecting material to deform a path of light L incident from the outside.

According to an example embodiment, the prism 2105 may change the path of light L incident in the first direction X to the second direction Y perpendicular to the first direction X. Also, the prism 2105 may rotate the reflective surface 2107 of the light reflecting material in an A direction or a B direction around a center axis 2106, thereby changing the path of the light L incident in the first direction X to the second direction Y perpendicular to the first direction X. The OPFE 2110 may also move in a third direction Z perpendicular to the first direction X and second direction Y.

In the example embodiment, the maximum rotatable angle of the prism 2105 in the direction A may be, e.g., less than or equal to 15 degrees in the positive (+) A direction and may be greater than 15 degrees in the negative (−) A direction.

In an example embodiment, prism 2105 may be rotated by, e.g., around 20 degrees, between 10 degrees and 20 degrees, or between 15 degrees and 20 degrees in the positive (+) or negative (−) B direction. Here, the prism 2105 may be rotated by the same angle or similar angles that are different from each other by around 1 degree in the positive (+) B direction and the negative (−) B direction.

In an example embodiment, the prism 2105 may move the reflective surface 2107 of the light reflecting material in the third direction (e.g., a Z direction) parallel to the direction in which the center axis 2106 extends.

For example, the OPFE 2110 may include optical lenses including m (where m is a natural number) groups. The m lens groups may move in the second direction Y and change the optical zoom ratio of the camera module 2100b. For example, when the basic optical zoom ratio of the camera module 2100b is Z and the m optical lenses included in the OPFE 2110 are moved, the optical zoom ratio of the camera module 2100b may be changed to 3Z, 5Z, or an optical zoom ratio higher than 5Z.

The actuator 2130 may move the OPFE 2110 or optical lenses (hereinafter referred to as an optical lens) to a particular position. For example, the actuator 2130 may adjust the position of the optical lens, such that the image sensor 2142 is positioned at the focal length of the optical lens for accurate sensing.

The image sensing device 2140 may include an image sensor 2142, a control logic 2144, an encoder 2145, and a memory 2146. The image sensor 2142 may sense an image of a sensing target using light L provided through an optical lens. The image sensor 2142 of FIG. 15 may be functionally similar to the image sensor 100 of FIG. 1, and thus, a redundant description thereof is omitted. The control logic 2144 may control an overall operation of the second camera module 2100b. For example, the control logic 2144 may control the operation of the second camera module 2100b according to a control signal provided through a control signal line CSLb.

The memory 2146 may store information used for the operation of the second camera module 2100b, e.g., calibration data 2147. The calibration data 2147 may include information used for the second camera module 2100b to generate image data by using the light L provided from the outside. The calibration data 2147 may include, e.g., information about a degree of rotation described above, information about a focal length, information about an optical axis, etc. When the second camera module 2100b is implemented in the form of a multi-state camera in which the focal length is changed depending on the position of the optical lens, the calibration data 2147 may include focal distance values for respective positions (or states) of the optical lens and information related to auto focusing.

The storage 2150 may store image data sensed through the image sensor 2142. The storage 2150 may be provided outside the image sensing device 2140 and may be stacked with a sensor chip constituting the image sensing device 2140. In an example embodiment, the storage 2150 may be implemented with, e.g., an EEPROM.

Referring to FIGS. 14 and 15 together, in an example embodiment, one camera module (e.g., first camera module 2100a) from among a plurality of camera modules 2100a, 2100b, and 2100c may include four sub-pixels that are adjacent to one another and share the same color information in one color pixel (i.e., tetra cell), and another camera module (e.g., the second camera module 2100b) may include nine sub-pixels that are adjacent to one another and share the same color information in one color pixel (i.e., nona cell).

In an example embodiment, the camera modules 2100a, 2100b, and 2100c may each include an actuator 2130. The camera modules 2100a, 2100b, and 2100c may include the same or different calibration data 2147 according to the operation of actuators 2130 included therein.

In an example embodiment, one camera module (e.g., the second camera module 2100b) from among the camera modules 2100a, 2100b, and 2100c may be a folded lens type camera module including the prism 2105 and the OPFE 2110 as described above, and the other camera modules (e.g., 2100a and 2100c) may be vertical type camera module without the prism 2105 and the OPFE 2110.

In an example embodiment, one camera module (e.g., a third camera module 2100c) from among the camera modules 2100a, 2100b, and 2100c may be a vertical type depth camera that extracts depth information by using an infrared ray (IR), for example. In this case, the AP 2200 may generate a 3D depth image by merging image data provided from such a depth camera with image data provided from another camera module (e.g., the first camera module 2100a or the second camera module 2100b).

In an example embodiment, at least two camera modules (e.g., first camera module 2100a and second camera module 2100b) from among the camera modules 2100a, 2100b, and 2100c may have different field of views (FOVs). In this case, e.g., at least two camera modules (e.g., the first camera module 2100a and the second camera module 2100b) from among the camera modules 2100a, 2100b, and 2100c may have different optical lenses. For example, the first camera module 2100a from among the camera modules 2100a, 2100b, and 2100c may have a smaller FOV than the second camera module 2100b and the third camera module 2100c. In another implementation, the multi-camera module 2100 may further include a camera module having a larger FOV than the camera modules 2100a, 2100b, and 2100c.

Furthermore, the camera modules 2100a, 2100b, and 2100c may be different FOVs from one another, in which case optical lenses included in the camera modules 2100a, 2100b, and 2100c may also be different from one another.

In an example embodiment, the camera modules 2100a, 2100b, and 2100c may be physically separated from one another. Thus, the camera modules 2100a, 2100b, and 2100c may not divide and use the sensing area of one image sensor 2142. Rather, an independent image sensor 2142 may be provided inside each of the camera modules 2100a, 2100b, and 2100c.

The AP 2200 may include a plurality of sub-processors 2210a, 2210b, and 2210c, a camera module controller 2230, a memory controller 2400, and an internal memory 2500. The AP 2200 may be implemented separately from the camera modules 2100a, 2100b, and 2100c. For example, the AP 2200 and the camera modules 2100a, 2100b, and 2100c may be implemented separately from each other as separate semiconductor chips.

Image data generated by the camera module 2100a, 2100b, and 2100c may be respectively provided to corresponding sub-processors 2210a, 2210b, and 2210c through image signal lines ISLa, ISLb, and ISLc separated from one another. For example, image data generated from the first camera module 2100a may be provided to a first sub-processor 2210a through a first image signal line ISLa, image data generated from the second camera module 2100b may be provided to a second sub-processor 2210b through a second image signal line ISLb, and image data generated from the third camera module 2100c may be provided to a third sub-processor 2210c through a third image signal line ISLc. The transmission of image data may be performed by using, e.g., a camera serial interface based on the MIPI.

In another example embodiment, one sub-processor may be provided to correspond to a plurality of camera modules. For example, the first sub-processor 2210a and the third sub-processor 2210c may be integrally implemented as a single sub-processor instead of being implemented separate from each other, and image data provided from the first camera module 2100a and the third camera module 2100c may be selected by a selecting element (e.g., a multiplexer) and provided to an integrated sub-image processor.

The camera module controller 2230 may provide a control signal to each of the camera module 2100a, 2100b, and 2100c. A control signal generated from the camera module controller 2230 may be provided to corresponding camera modules 2100a, 2100b, and 2100c through control signal lines CSLa, CSLb, and CSLc separated from one another.

By way of summation and review, in order to reduce power consumption during a counting period, a pulse generator method may be applied. In the pulse generator method, a pulse may be generated for a short time from the moment an output of a correlated double sampling (CDS) circuit is generated, and data may be stored only in a period during which the pulse is generated.

As described above, embodiments may provide a pulse generator for generating a pulse signal synchronized with a clock signal, and an image sensor including the same.

Embodiments may provide a pulse generator for generating a pulse signal synchronized with a clock signal, and an image sensor including the same.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An image sensor, comprising:
    a counting code generator configured to generate a counting code;
    a pixel array including at least one pixel;
    a correlated double sampling circuit configured to compare a magnitude of a pixel signal output from the at least one pixel with a magnitude of a ramp signal, and to output a comparison signal;
    a pulse generator configured to generate a pulse signal synchronized with a first clock signal based on the comparison signal; and
    a counter circuit configured to latch a code value of the counting code to correspond to a transition of a level of the comparison signal based on the pulse signal.

2. The image sensor as claimed in claim 1, wherein the pulse generator includes:
    a clock synchronization circuit configured to output a pull-up signal and a pull-down signal synchronized with the first clock signal based on the comparison signal;
    a pull-up latch circuit configured to generate a first output signal based on the pull-up signal;
    a pull-down latch circuit configured to generate a second output signal based on the pull-down signal; and
    an output circuit configured to generate the pulse signal based on the first output signal and the second output signal.

3. The image sensor as claimed in claim 2, wherein the clock synchronization circuit is configured to:
    receive a first feedback signal from the pull-up latch circuit, and to output the pull-up signal based on the first feedback signal and the comparison signal, and
    receive a second feedback signal from the pull-down latch circuit, and to output the pull-down signal based on the second feedback signal and the comparison signal.

4. The image sensor as claimed in claim 3, wherein the clock synchronization circuit includes:
    a first NAND gate configured to receive the comparison signal and the first feedback signal;
    a first inverter configured to operate based on an output signal from the first NAND gate, and to output the pull-up signal by inverting the first clock signal; and
    a first transistor configured to operate based on the output signal from the first NAND gate, and connected to an output terminal of the first inverter.

5. The image sensor as claimed in claim 4, wherein the clock synchronization circuit further includes:
    a second NAND gate configured to receive the comparison signal and the second feedback signal;
    a second inverter configured to operate based on an output signal from the second NAND gate, and to output the pull-down signal by inverting the first clock signal; and
    a second transistor configured to operate based on the output signal from the second NAND gate, and connected to an output terminal of the first inverter.

6. The image sensor as claimed in claim 5, wherein:
    the first transistor includes an NMOS transistor, and
    the second transistor includes a PMOS transistor.

7. The image sensor as claimed in claim 3, wherein the pull-up latch circuit includes:
    a third inverter configured to operate based on a first inverted feedback signal, obtained by inverting the first feedback signal, and the pull-up signal, and to output a first signal by inverting the first output signal;

a first NOR gate configured to receive the first signal and a reset signal;

a fourth inverter configured to operate based on the first inverted feedback signal and the pull-up signal, and to output the first signal by inverting an output signal from the first NOR gate;

a second NOR gate configured to receive the first signal and the pull-up signal, and to output the first inverted feedback signal;

a first NOT gate configured to output the first feedback signal by inverting the first inverted feedback signal; and a third NAND gate configured to receive the first inverted feedback signal and the output signal from the first NOR gate, and to output the first output signal.

8. The image sensor as claimed in claim 7, wherein: an output terminal of the third inverter is connected to an output terminal of the fourth inverter, and an output terminal of the third NAND gate is connected to an input terminal of the third inverter.

9. The image sensor as claimed in claim 3, wherein the pull-down latch circuit includes:

a fifth inverter configured to operate based on the pull-down signal and the second feedback signal, and to output a second signal by inverting the second output signal;

a fourth NAND gate configured to receive an inverted reset signal, obtained by inverting a reset signal, and the second signal;

a sixth inverter configured to operate based on the second feedback signal and the pull-down signal, and to output the second signal by inverting an output signal from the fourth NAND gate;

a fifth NAND gate configured to receive the second signal and the pull-down signal, and to output the second feedback signal; and a third NOR gate configured to receive the second feedback signal and the output signal from the fourth NAND gate, and to output the second output signal.

10. The image sensor as claimed in claim 9, wherein: an output terminal of the fifth inverter is connected to an output terminal of the sixth inverter, and an output terminal of the third NOR gate is connected to an input terminal of the fifth inverter.

11. The image sensor as claimed in claim 3, wherein the output circuit includes:

an XOR gate configured to receive the first output signal and the second output signal; and a second NOT gate configured to generate the pulse signal by inverting an output signal from the XOR gate.

12. The image sensor as claimed in claim 2, wherein the counter circuit is configured to latch a least significant bit of the code value based on the pull-up signal and the pull-down signal.

13. The image sensor as claimed in claim 1, further comprising:

a timing controller configured to generate a reference clock signal; and a counting code generator configured to generate the first clock signal by dividing the reference clock signal.

14. The image sensor as claimed in claim 13, wherein the pulse generator is configured to generate the pulse signal by operating for a time corresponding to one cycle of the reference clock signal.

15. A pulse generator, comprising:

a clock synchronization circuit configured to receive an input signal and a first clock signal, and to output a pull-up signal and a pull-down signal synchronized with the first clock signal based on the input signal;

a pull-up latch circuit configured to generate a first output signal based on the pull-up signal;

a pull-down latch circuit configured to generate a second output signal based on the pull-down signal; and an output circuit configured to generate a pulse signal based on the first output signal and the second output signal.

16. The pulse generator as claimed in claim 15, wherein the clock synchronization circuit includes:

a first NAND gate configured to receive the input signal and a first feedback signal;

a first inverter configured to operate based on an output signal from the first NAND gate, and to output the pull-up signal by inverting the first clock signal; and a first transistor configured to operate based on the output signal from the first NAND gate, and connected to an output terminal of the first inverter.

17. The pulse generator as claimed in claim 16, wherein the clock synchronization circuit further includes:

a second NAND gate configured to receive the input signal and a second feedback signal;

a second inverter configured to operate based on an output signal from the second NAND gate, and to output the pull-down signal by inverting the first clock signal; and a second transistor configured to operate based on the output signal from the second NAND gate, and connected to an output terminal of the first inverter.

18. The pulse generator as claimed in claim 17, wherein the pull-up latch circuit includes:

a third inverter configured to operate based on a first inverted feedback signal, obtained by inverting the first feedback signal, and the pull-up signal, and to output a first signal by inverting the first output signal;

a first NOR gate configured to receive the first signal and a reset signal;

a fourth inverter configured to operate based on the first inverted feedback signal and the pull-up signal, and to output the first signal by inverting an output signal from the first NOR gate;

a second NOR gate configured to receive the first signal and the pull-up signal, and to output the first inverted feedback signal;

a first NOT gate configured to output the first feedback signal by inverting the first inverted feedback signal; and a third NAND gate configured to receive the first inverted feedback signal and an output signal from the first NOR gate, and to output the first output signal.

19. The pulse generator as claimed in claim 18, wherein the pull-down latch circuit includes: a fifth inverter configured to operate based on the pull-down signal and the second feedback signal, and to output a second signal by inverting the second output signal;

a fourth NAND gate configured to receive an inverted reset signal, obtained by inverting a reset signal, and the second signal;

a sixth inverter configured to operate based on the second feedback signal and the pull-down signal, and to output the second signal by inverting an output signal from the fourth NAND gate;

a fifth NAND gate configured to receive the second signal and the pull-down signal, and to output the second feedback signal; and a third NOR gate configured to receive the second feedback signal and the output signal from the fourth NAND gate, and to output the second output signal.

20. An image sensor, comprising:
a pixel array including at least one pixel;
a correlated double sampling circuit configured to compare a magnitude of a pixel signal output from the at least one pixel with a magnitude of a ramp signal, and to output a comparison signal;
a timing controller configured to generate a reference clock signal;
a counting code generator configured to generate a first clock signal by dividing the reference clock signal, and to generate a counting code;
a pulse generator configured to be delayed for a certain time from a timing at which a level of the comparison signal transitions, and to generate a pulse signal including a pulse having a pulse width corresponding to the first clock signal; and
a counter circuit configured to latch a code value of the counting code based on the pulse signal.

* * * * *